(12) United States Patent
Shioga et al.

(10) Patent No.: US 10,624,238 B2
(45) Date of Patent: Apr. 14, 2020

(54) LOOP HEAT PIPE AND MANUFACTURING METHOD FOR LOOP HEAT PIPE AND ELECTRONIC DEVICE

(71) Applicant: FUJITSU LIMITED, Kawasaki-shi, Kanagawa (JP)

(72) Inventors: Takeshi Shioga, Atsugi (JP); Tomoyuki Abe, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/196,007

(22) Filed: Nov. 20, 2018

(65) Prior Publication Data
US 2019/0090386 A1    Mar. 21, 2019

Related U.S. Application Data

(63) Continuation of application No. PCT/JP2016/065194, filed on May 23, 2016.

(51) Int. Cl.
*H05K 7/20* (2006.01)
*G06F 1/16* (2006.01)
*H01L 23/373* (2006.01)
*F28D 15/02* (2006.01)
(Continued)

(52) U.S. Cl.
CPC .......... *H05K 7/20336* (2013.01); *B23P 15/26* (2013.01); *F28D 15/0233* (2013.01);
(Continued)

(58) Field of Classification Search
CPC . H01L 23/427; H01L 23/3672; H01L 23/473; H01L 2225/06589; F28D 15/0266;
(Continued)

(56) References Cited

U.S. PATENT DOCUMENTS

| | | | |
|---|---|---|---|
| 2006/0157227 A1* | 7/2006 | Choi | B82Y 30/00 165/104.21 |
| 2010/0044014 A1 | 2/2010 | Ho | |

(Continued)

FOREIGN PATENT DOCUMENTS

| | | |
|---|---|---|
| JP | 60-178291 | 9/1985 |
| JP | 2008-281275 | 11/2008 |

(Continued)

OTHER PUBLICATIONS

International Search Report and Written Opinion of the International Searching Authority, mailed in connection with PCT/JP2016/065194, dated Aug. 2, 2016 (17 pages), with partial English translation.

(Continued)

*Primary Examiner* — Mandeep S Buttar
(74) *Attorney, Agent, or Firm* — Fujitsu Patent Center

(57) ABSTRACT

A loop heat pipe includes an evaporator; a condenser; a first pipe configured to connect the evaporator and the condenser and in which vapor-phase working fluid flows; and a second pipe configured to connect the condenser and the evaporator and in which liquid-phase working fluid flows, wherein the evaporator, the condenser, the first pipe, and the second pipe is joined to a first tabular and a second tabular, respectively, the first tabular includes a first recessed section in a region to be formed as the evaporator and a region to be formed as a condensation pipe configuring the condenser and the second tabular includes a second recessed section in the region to be formed as the evaporator, the region to be formed as the condensation pipe.

17 Claims, 17 Drawing Sheets

(51) Int. Cl.
  *H01L 21/48* (2006.01)
  *H01L 23/427* (2006.01)
  *B23P 15/26* (2006.01)
  *F28D 15/04* (2006.01)
  *G06F 1/20* (2006.01)

(52) U.S. Cl.
  CPC ......... *F28D 15/043* (2013.01); *F28D 15/046* (2013.01); *G06F 1/1626* (2013.01); *H01L 21/4882* (2013.01); *H01L 23/3736* (2013.01); *H01L 23/427* (2013.01); *H05K 7/20309* (2013.01); *H05K 7/20318* (2013.01); *B23P 2700/09* (2013.01); *G06F 1/203* (2013.01); *G06F 2200/201* (2013.01)

(58) Field of Classification Search
  CPC .. F28D 15/0275; F28D 15/046; F28D 15/043; F28D 15/06; F28D 15/0233; F28D 15/04; F28D 15/0241; F28D 15/0283; F28D 2021/0028; F28D 15/02; F28D 1/0477; F28D 2015/0225; F28D 2021/0064; F28D 2021/0071; F28D 2021/0085; H05K 7/20336; H05K 7/20309; H05K 7/20318; H05K 7/20936; H05K 7/20963; F28F 3/02; F28F 13/06; F28F 13/08; F25B 39/02; F25B 39/00; G06F 1/203; G06F 2200/201; G06F 1/20; B23P 2700/09
  USPC .......... 361/700; 165/104.26, 104.21, 104.33; 257/E23.088, E23.082
  See application file for complete search history.

(56) References Cited

U.S. PATENT DOCUMENTS

| | | | | |
|---|---|---|---|---|
| 2013/0223010 | A1* | 8/2013 | Shioga | H01L 23/13 361/700 |
| 2014/0138056 | A1* | 5/2014 | Horng | F28F 3/048 165/104.21 |
| 2015/0077929 | A1* | 3/2015 | Honmura | F28D 15/0233 361/679.52 |
| 2016/0259383 | A1* | 9/2016 | Shioga | F28D 15/0266 |

FOREIGN PATENT DOCUMENTS

| | | |
|---|---|---|
| JP | 2009-109079 | 5/2009 |
| JP | 2015-059693 | 3/2015 |
| JP | 2015-183880 | 10/2015 |
| JP | 2016-075437 | 5/2016 |
| JP | 2016-090204 | 5/2016 |
| WO | 2012/046338 | 4/2012 |
| WO | 2015/087451 | 6/2015 |

OTHER PUBLICATIONS

JPOA-Office Action of Japanese Patent Application No. 2018-518822 dated Oct. 8, 2019 with Full Machine Translation. All references cited in the JPOA were previously submitted in the IDS filed on Nov. 20, 2019.

* cited by examiner

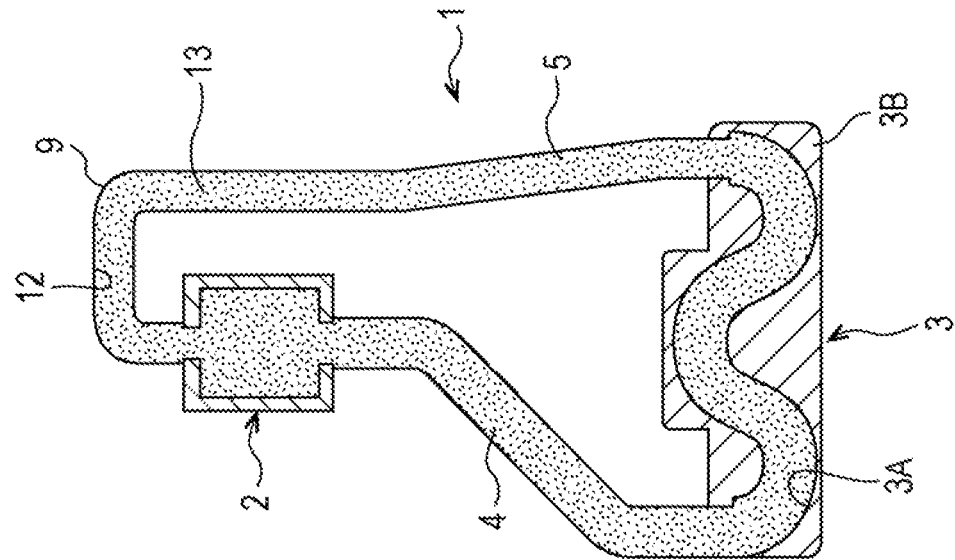
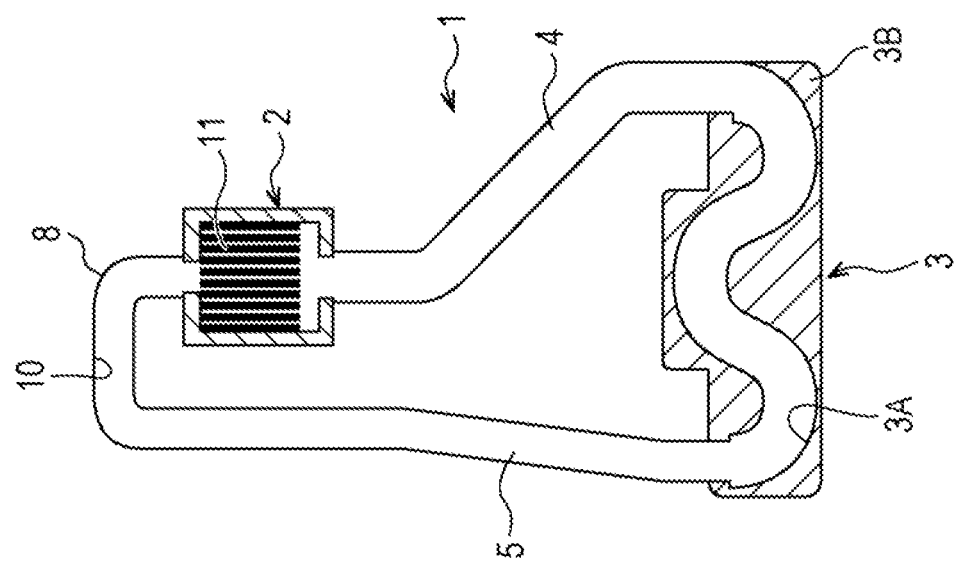

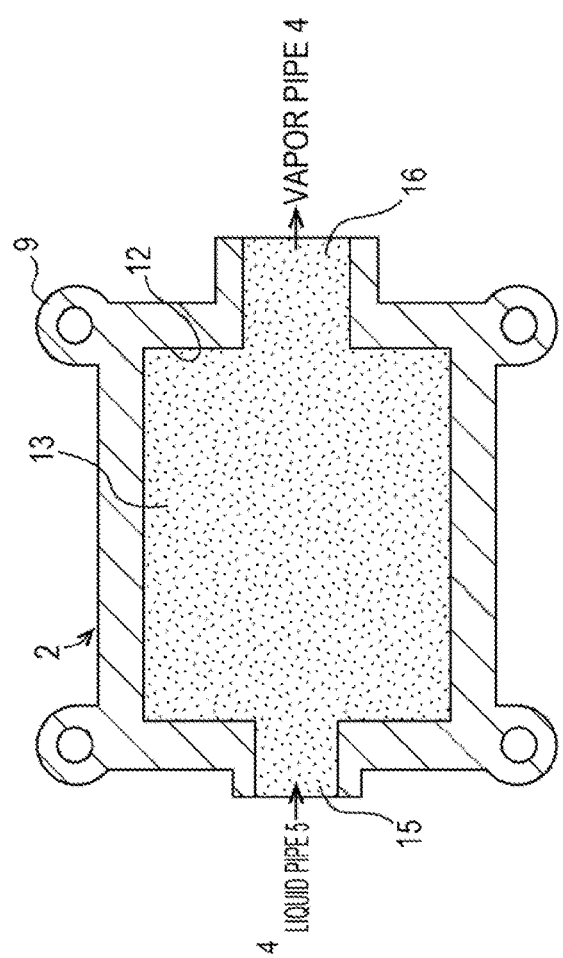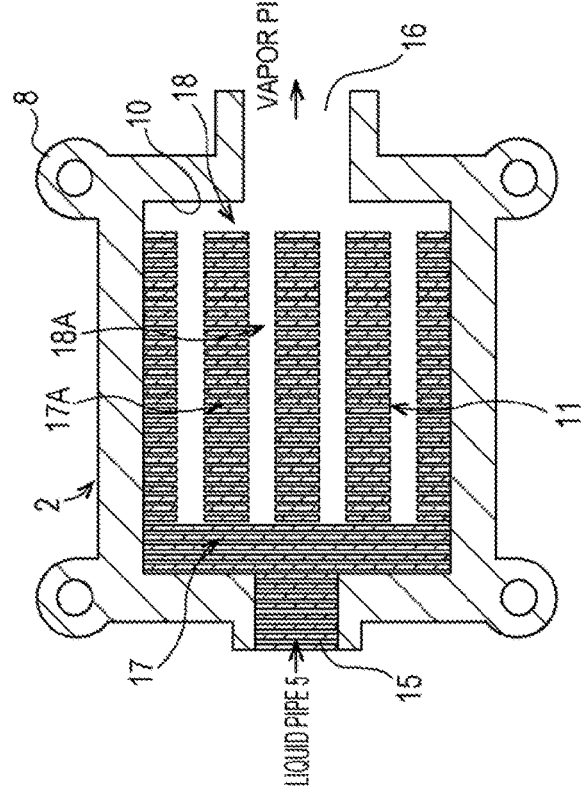

LOOP HEAT PIPE AND MANUFACTURING METHOD FOR LOOP HEAT PIPE AND ELECTRONIC DEVICE

CROSS-REFERENCE TO RELATED APPLICATION

This application is a continuation application of International Application PCT/JP2016/065194 filed on May 23, 2016 and designated the U.S., the entire contents of which are incorporated herein by reference.

FIELD

The embodiment discussed herein is related to a loop heat pipe and a manufacturing method for the loop heat pipe and an electronic device.

BACKGROUND

For example, in portable small and thin electronic devices (mobile devices) such as a smartphone and a tablet terminal, sheet-like heat conducting members such as a metal plate and a heat diffusion sheet are widely used to transfer heat of a heat generating component. For example, as the metal plate, copper, aluminum, a magnesium alloy, a thin plate formed by stacking the copper, the aluminum, and the magnesium alloy, and the like are used. The performance of heat conduction of the metal plate depends on the thermal conductivity of a material. For example, as the heat diffusion sheet, a graphite sheet is used. The thermal conductivity of the graphite sheet is approximately 500 to 1500 W/mK. At the thermal conductivity of this degree, when the amount of heat of the heat generating component increases, it is likely that heat transfer is unable to be sufficiently performed only by heat conduction of the material.

Therefore, in order to efficiently transfer and diffuse a larger heat quantity, it is conceivable to use a heat pipe, which is a heat transfer device that makes use of the latent heat of a vaporized fluid. For example, when heat transfer of a heat pipe having a diameter of approximately 3 to 4 mm is converted into thermal conductivity, the thermal conductivity is equivalent to approximately 1500 to 2500 W/mK. The heat pipe illustrates a large value compared with a sheet-like heat conducting member that makes use of heat conduction of a material.

However, for efficient heat transport, the diameter of a pipe, which is a heat transfer pipe, requires to be increased in order to improve fluidity of the working fluid. This is a problem in mounting the heat pipe on an electronic device, therefore the application of the heat pipe to a mobile device does not make a progress. In this case, it conceivable to form the heat pipe flat in shape. However, when the heat pipe is formed flat, a flow of a working fluid in the pipe is interrupted, and the performance of the heat transport is deteriorated.

On the other hand, in a loop heat pipe, flows of a vapor-phase working fluid and a liquid-phase working fluid are independent from each other, and flowing direction of the working fluid is one direction. Compared with the heat pipe in which the liquid-phase working fluid and the vapor-phase working fluid are opposed to each other in a single pipe, the flow resistance of the working fluid in a loop heat pipe may be reduced, and the heat transport will be possible to be efficient. Therefore, it is conceivable to use the loop heat pipe for a mobile device.

Related art is described in, for example, Japanese Laid-open Patent Publication No. 60-178291 and International Publication Pamphlet No. WO 2015/087451.

SUMMARY

According to an aspect of the embodiments, a loop heat pipe includes an evaporator; a condenser; a first pipe configured to connect the evaporator and the condenser and in which vapor-phase working fluid flows; and a second pipe configured to connect the condenser and the evaporator and in which liquid-phase working fluid flows, wherein the evaporator, the condenser, the first pipe, and the second pipe is configured to join a first tabular and a second tabular, the first tabular includes a first recessed section in a region to be formed as the evaporator, a region to be formed as a condensation pipe configuring the condenser, a region to be formed as the first pipe, and a region to be formed as the second pipe and includes, in the region to be formed as the evaporator, grooves capable of generating a capillary force, the second tabular includes a second recessed section in the region to be formed as the evaporator, the region to be formed as the condensation pipe, the region to be formed as the first pipe, and the region to be formed as the second pipe, and a porous structure is provided in the second recessed section.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 1A and 1B are schematic plan views illustrating the configuration of a loop heat pipe according to an embodiment, FIG. 1A illustrating the configuration of a first tabular and FIG. 1B illustrating the configuration of a second tabular;

FIGS. 2A and 2B are schematic plan views illustrating a configuration example of the loop heat pipe according to the embodiment, FIG. 2A illustrating a configuration example of an evaporator portion of the first tabular and FIG. 2B illustrating a configuration example of an evaporator portion of the second tabular;

DESCRIPTION OF EMBODIMENTS

A loop heat pipe and a manufacturing method for the loop heat pipe and an electronic device according to an embodiment are explained below with reference to the drawings. First, the loop heat pipe according to this embodiment is explained with reference to FIGS. 1 to 18. The loop heat pipe according to this embodiment is a flat loop heat pipe included in a portable small and thin electronic device such as a smartphone, a tablet terminal, or a digital camera, that is, for example, an electronic device for mobile use (a mobile device) to transfer heat generated by a heat generating component (for example, an LSI chip) embedded in the electronic device and to cool the heat generating component. The heat generating component is referred to as an electronic component or a heat generating element as well.

The loop heat pipe according to this embodiment includes, as illustrated in FIGS. 1A and 1B, an evaporator 2 in which a liquid-phase working fluid evaporates, a condenser 3 in which a vapor-phase working fluid condenses, a vapor pipe 4 that connects the evaporator 2 and the condenser 3 and in which the vapor-phase working fluid flows, and a liquid pipe 5 that connects the condenser 3 and the evaporator 2 and in which the liquid-phase working fluid flows. The condenser 3 includes a condensation pipe 3A and a heat diffusion plate (a heat radiation plate; a heat radiating plate) 3B.

Figure 8:
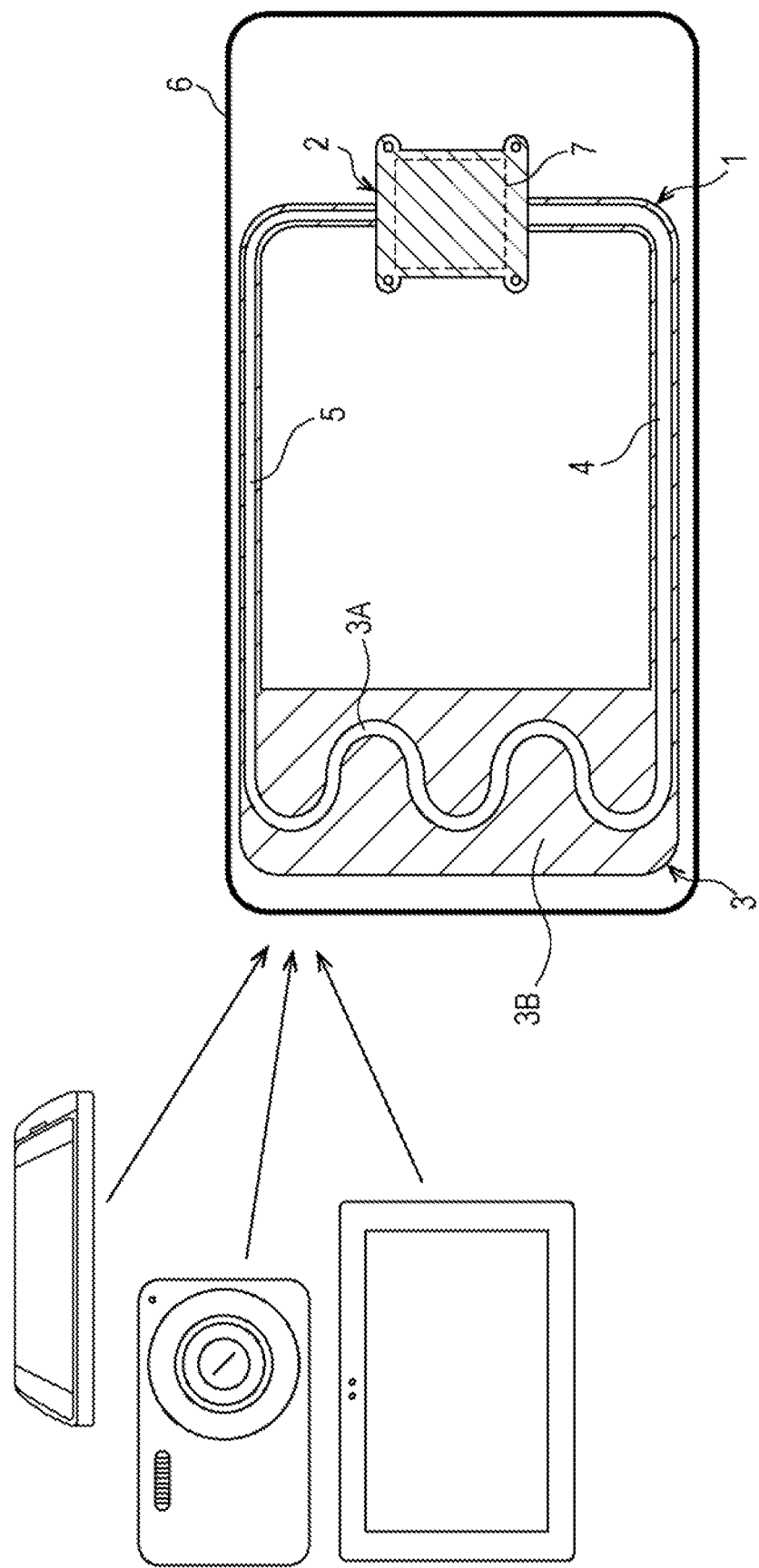
FIG. 8 is a schematic diagram illustrating the configuration of an electronic device including the loop heat pipe according to the embodiment.
Figure 9:
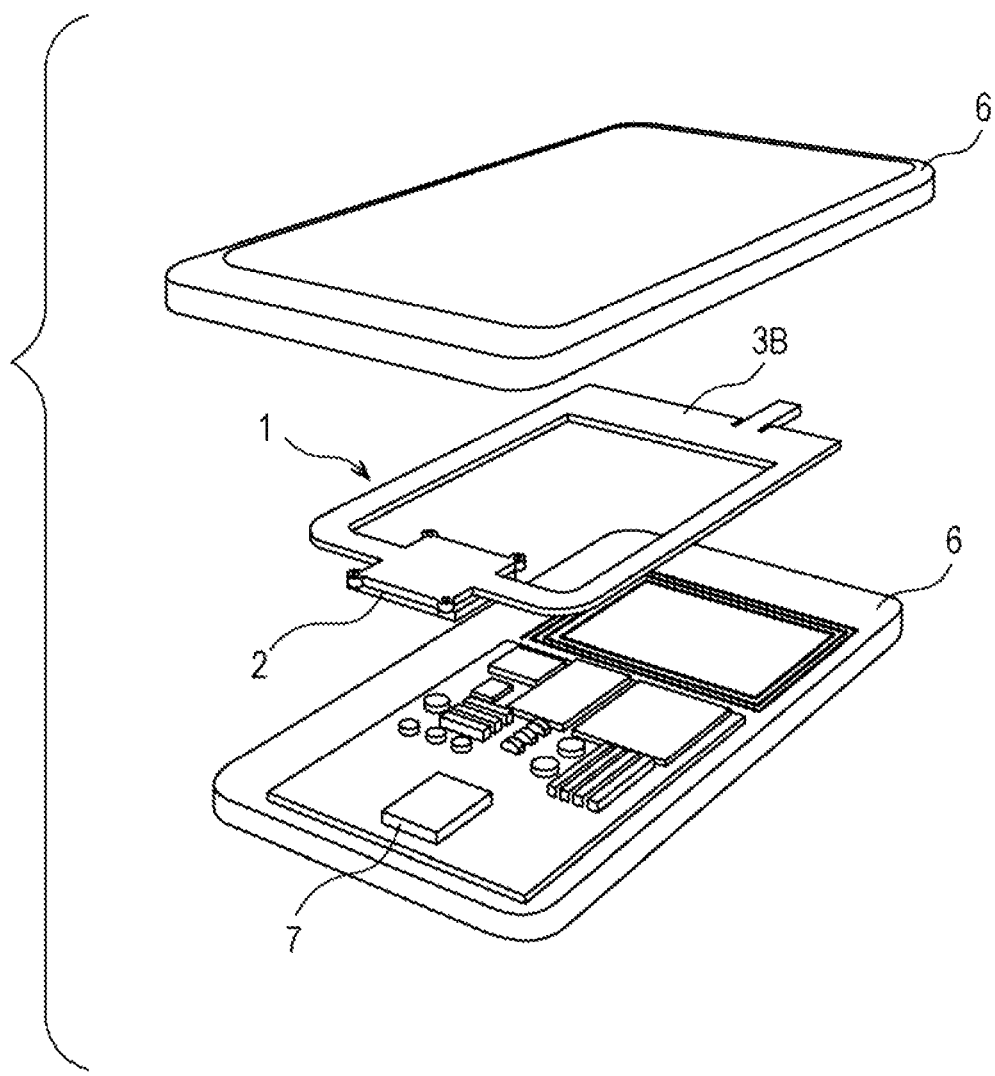
FIG. 9 is a schematic diagram illustrating the configuration of the electronic device including the loop heat pipe according to the embodiment.

As illustrated in FIGS. 8 and 9, a loop heat pipe 1 configured in this way is housed on the inside of a mobile device 6 such that the evaporator 2 is thermally connected to a heat generating component 7 embedded in the mobile device 6 such as the smartphone, the tablet terminal, or the digital camera. A working fluid is, for example, water, ethanol, acetone, methanol, or fluorocarbons.

The evaporator 2 includes one liquid flow inlet and one vapor flow outlet. The condenser 3 includes one vapor flow inlet and a liquid flow outlet. The vapor flow outlet of the evaporator 2 and the vapor flow inlet of the condenser 3 are connected via the vapor pipe 4. The liquid flow outlet of the condenser 3 and the liquid flow inlet of the evaporator 2 are connected via the liquid pipe 5. That is, for example, the evaporator 2, the vapor pipe 4, the condenser 3, and the liquid pipe 5 are coupled in a loop shape. The working fluid filled in the evaporator 2, the vapor pipe 4, the condenser 3, and the liquid pipe 5 flows in one direction.

The working fluid changes from a liquid phase to a vapor phase by heat from the heat generating component 7 to the evaporator 2, moves to the condenser 3 through the vapor pipe 4 while involving heat, changes from the vapor phase to the liquid phase according to heat radiation in the condenser 3, and returns to the evaporator 2 through the liquid pipe 5. Therefore, compared with a heat pipe in which the liquid-phase working fluid and the vapor-phase working fluid reciprocate in a pipe, the flow resistance of the working fluid may be reduced and the efficient heat transport will be possible.

In this embodiment, as illustrated in FIGS. 1A and 1B, the evaporator 2, the condenser 3, the vapor pipe 4, and the liquid pipe 5 have structure obtained by joining a first tabular 8 and a second tabular 9. That is, for example, the evaporator 2, the condenser 3, the vapor pipe 4, and the liquid pipe 5 are configured from upper and lower two tabulars 8 and 9. As illustrated in FIG. 1A, the first tabular 8 includes a first recessed section 10 in a region to be formed as the evaporator 2, a region to be formed as the condensation pipe 3A configuring the condenser 3, a region to be formed as the vapor pipe 4, and a region to be formed as the liquid pipe 5 and includes, in the region to be formed as the evaporator 2, grooves 11 capable of generating a capillary force.

The first recessed section 10 and the grooves 11 have depths smaller than a plate thickness. A recessed section is referred to as a recessed structure as well. A groove is referred to as a fine groove or a recessed section having a fine width as well. The first tabular 8 is a metal plate (a metal thin plate) and is, specifically, for example, a copper plate (a copper thin plate). The first tabular 8 includes, in the region to be formed as the evaporator 2, the region to be formed as the condensation pipe 3A configuring the condenser 3, the region to be formed as the vapor pipe 4, and the region to be formed as the liquid pipe 5, the first recessed section 10 provided to have depth smaller than the plate thickness by processing such as half-etching.

The first tabular 8 includes, in the region to be formed as the evaporator 2, a plurality of grooves 11 capable of generating a capillary force provided to have depth smaller than the plate thickness by processing such as half-etching. The plurality of grooves 11 only have to be grooves capable of generating a capillary force. The plurality of grooves 11 may be, for example, grooves extending in a length direction directed from a side to which the liquid pipe 5 is connected to a side to which the vapor pipe 4 is connected or may be grooves extending in a width direction crossing the length direction. The plurality of grooves 11 are desirably formed in parallel to one another, that is, for example, in the same direction.

In FIG. 1A, grooves extending in the length direction are illustrated as the plurality of grooves 11. The length direction is referred to as a length direction of the evaporator 2 as well. The width direction is referred to as a width direction of the evaporator 2 as well. As illustrated in FIG. 1B, the second tabular 9 includes a second recessed section 12 in the region to be formed as the evaporator 2, the region to be formed as the condensation pipe 3A, the region to be formed as the vapor pipe 4, and the region to be formed as the liquid pipe 5. The second recessed section 12 has depth smaller than the plate thickness. The recessed section is referred to as a recessed structure as well.

The second tabular 9 is a metal plate (a metal thin plate) and is, specifically, for example, a copper plate (a copper thin plate). The second tabular 9 includes, in the region to be formed as the evaporator 2, the region to be formed as the condensation pipe 3A, the region to be formed as the vapor pipe 4, and the region to be formed as the liquid pipe 5, the second recessed section 12 provided to have depth smaller than the plate thickness by processing such as half-etching.

A porous structure 13 is provided in the second recessed section 12. The porous structure 13 is provided in all of the region to be formed as the evaporator 2, the region to be formed as the condensation pipe 3A, the region to be formed as the vapor pipe 4, and the region to be formed as the liquid pipe 5. The porous structure 13 is formed in structure in which vacancies are exposed to the surface of the structure and the vacancies communicate with one another. The diameter of the vacancies is desirably, for example, approximately 0.5 mm or less.

The porous structure 13 is provided in the second recessed section 12 of the second tabular 9 such that the vacancies are exposed to the side of the first recessed section 10 provided in the first tabular 8 when the first tabular 8 and the second tabular 9 are joined. In the porous structure 13, all the vacancies desirably communicate with one another. The porous structure 13 is configured by, for example, a structure configured by stacking wire-netted meshes made of metal, a structure configured by stacking sheet materials made of metal formed in a mesh shape by punching, a porous body made of sintered metal or fine ceramics, a porous body made of metal manufactured using a 3D printer, and nonwoven fabric manufactured from fiber made of metal.

The porous structure 13 only has to be provided in the recessed section (a space section) of at least one of the first tabular 8 and the second tabular 9. The first tabular 8 and the second tabular 9 configured in this way are joined to place the first recessed section 10 and the second recessed section 12 on the inner side. Consequently, a channel is formed by the first recessed section 10 and the second recessed section 12 in the region to be formed as the evaporator 2, the region to be formed as the condensation pipe 3A, the region to be formed as the vapor pipe 4, and the region to be formed as the liquid pipe 5.

A capillary force is generated by the grooves 11 provided in the region to be formed as the evaporator 2. The liquid-phase working fluid penetrates and changes to the vapor-phase working fluid. A loop operation in a top heat orientation may be realized by the porous structure 13 provided in the region to be formed as the evaporator 2, the region to be formed as the condensation pipe 3A, the region to be formed as the vapor pipe 4, and the region to be formed as the liquid pipe 5, that is, for example, the porous structure 13 provided over the entire region of the channel of the loop heat pipe 1.

The evaporator 2 desirably includes a liquid flow inlet 15 to which the liquid pipe 5 is connected, a vapor flow outlet 16 to which the vapor pipe 4 is connected, a comb teeth-like portion 17 that generates a capillary force and into which the liquid-phase working fluid penetrates to change to the vapor-phase working fluid, and a comb teeth-like vapor channel 18 in which the vapor-phase working fluid flows [see FIG. 2A]. The comb teeth-like portion 17 is divided and extends from a side to which the liquid pipe 5 is connected. The comb teeth-like portion 17 includes a divided plurality of portions (branching portions; rib-like portions) 17A. That is, for example, the comb teeth-like portion 17 is a portion extending in a comb teeth shape from the liquid flow inlet 15 toward the inside. The comb teeth-like portion 17 is connected to the liquid pipe 5.

The comb teeth-like vapor channel 18 is provided to be opposed to the comb teeth-like portion 17 and is divided and extends from a side to which the vapor pipe 4 is connected. The comb teeth-like vapor channel 18 includes a divided plurality of vapor channels 18A. That is, for example, the comb teeth-like vapor channel 18 is a vapor channel extending in a comb teeth shape from the vapor flow outlet 16 toward the inside. The comb teeth-like vapor channel 18 is connected to the vapor pipe 4. The vapor channel 18 is referred to as a vapor discharge channel because the vapor channel 18 is a channel for discharging the vapor-phase working fluid flowing on the inside of the evaporator 2 to the vapor pipe 4.

The divided plurality of vapor channels 18A in the comb teeth-like vapor channel 18 is provided among the divided plurality of portions 17A of the comb teeth-like portion 17. That is, for example, the divided plurality of portions 17A of the comb teeth-like portion 17 and the divided plurality of vapor channels 18A of the comb teeth-like vapor channel 18 are alternately disposed in an in-plane direction. Consequently, a reduction in the thickness of the evaporator 2 is achieved.

In this case, as illustrated in FIG. 2A, the comb teeth-like portion 17 and the comb teeth-like vapor channel 18 only have to be provided in the region to be formed as the evaporator 2 in the first tabular 8. The grooves 11 only have to be provided in the region to be formed as the comb teeth-like portion 17 in the first tabular 8. The first recessed section 10 only has to be provided in the region to be formed as the comb teeth-like vapor channel 18. The porous structure 13 only has to be provided in the second recessed section 12 provided in the region to be formed as the evaporator 2 in the second tabular 9 [see FIG. 2B]. The first tabular 8 and the second tabular 9 only have to be joined such that the comb teeth-like portion 17 and the comb teeth-like vapor channel 18 are opposed to the porous structure 13.

In this case, the plurality of grooves 11 included in the first tabular 8 is provided in the plurality of portions 17A sandwiched by the divided plurality of vapor channels 18A of the comb teeth-like vapor channel 18. The plurality of grooves 11 included in the first tabular 8 are grooves extending in a direction crossing (orthogonal to) the length direction. That is, for example, the plurality of grooves 11 are provided in parallel to one another and to extend in a direction crossing (orthogonal to) the divided plurality of vapor channels 18A (that is, for example, a direction in which vapor flows) of the comb teeth-like vapor channel 18.

Figure 3:
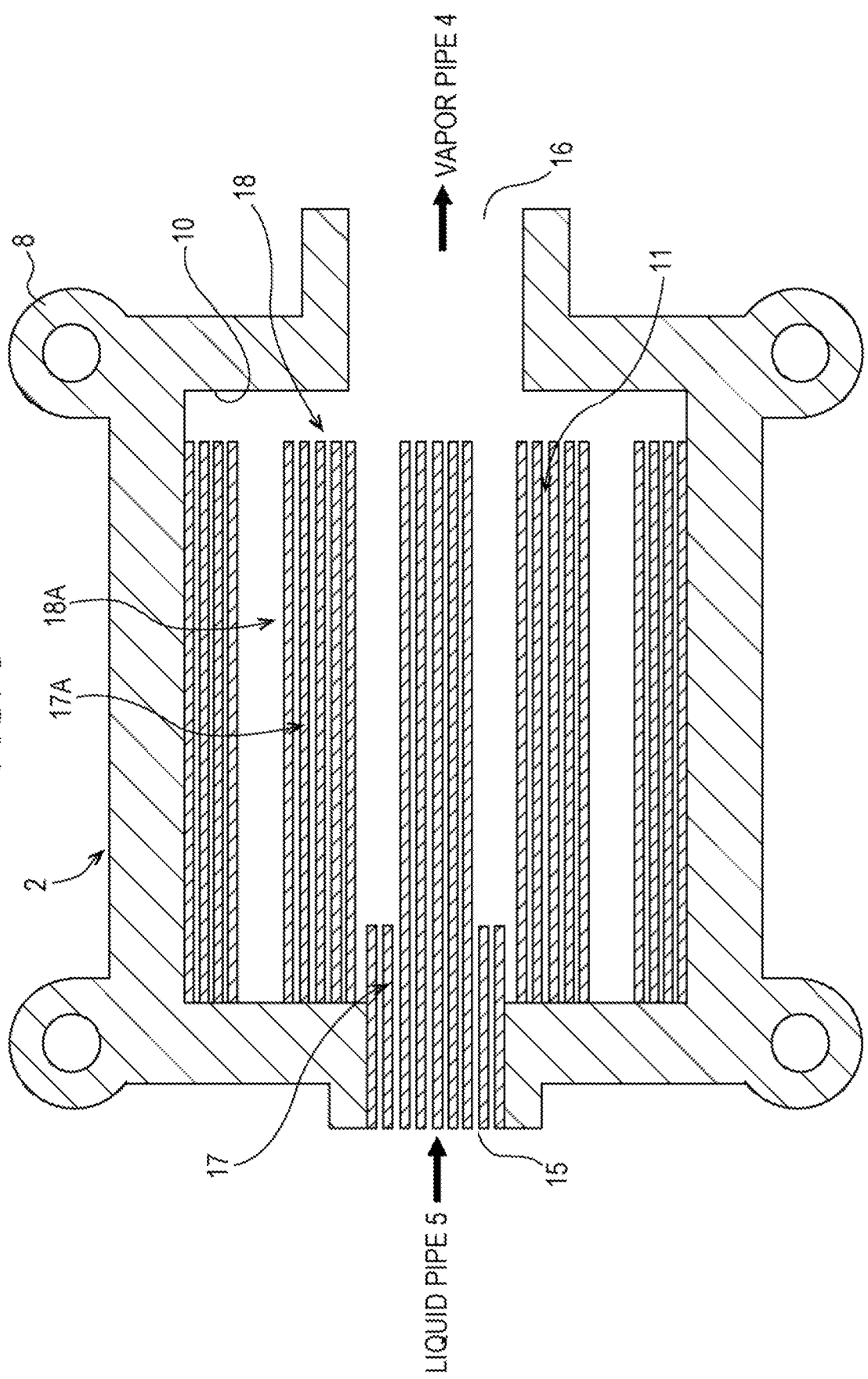
FIG. 3 is a schematic plan view illustrating a configuration example of the evaporator portion of the first tabular configuring the loop heat pipe according to the embodiment.
Figure 4:
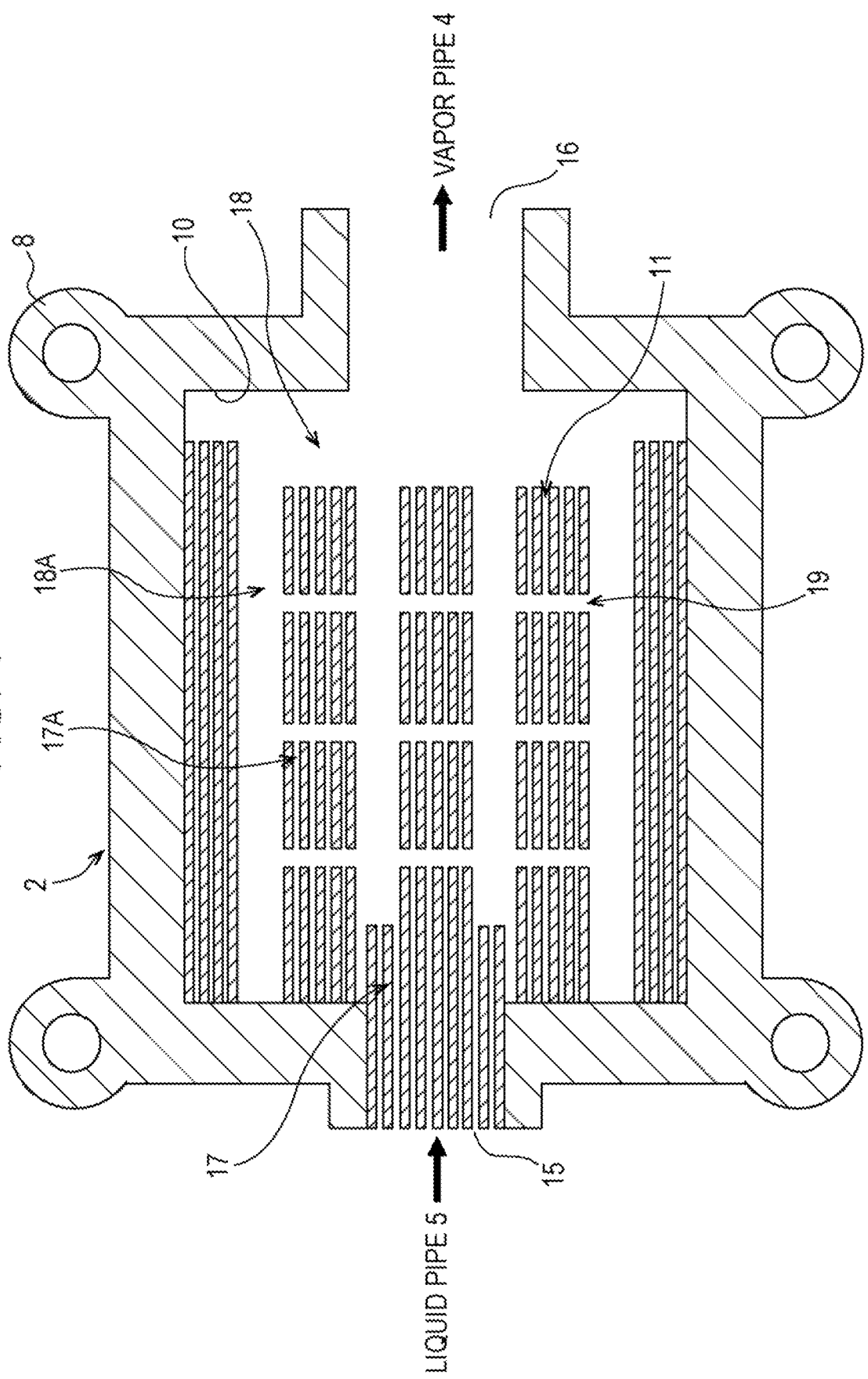
FIG. 4 is a schematic plan view illustrating a configuration example of the evaporator portion of the first tabular configuring the loop heat pipe according to the embodiment.

The plurality of grooves 11 are not limited to this. As illustrated in FIG. 3, the plurality of grooves 11 included in the first tabular 8 may be grooves extending in the length direction. That is, for example, the plurality of grooves 11 may be provided in parallel to one another and to extend in parallel to a direction in which the divided plurality of vapor channels 18A of the comb teeth-like vapor channel 18 extend. In this case, as illustrated in FIG. 4, each of the divided plurality of portions 17A of the comb teeth-like portion 17 desirably includes communication grooves 19 that cause adjacent two vapor channels 18A among the divided plurality in vapor channels 18A of the comb teeth-like vapor channel 18 to communicate.

That is, for example, the first tabular 8 desirably includes, in a region to be formed as the divided plurality of portions 17A in the comb teeth-like portion 17, the communication grooves 19 that cause the adjacent two vapor channels 18A among the divided plurality of vapor channels 18A of the comb teeth-like vapor channel 18 to communicate. By causing the adjacent vapor channels 18A to communicate by the communication grooves 19 in this way, a pressure difference between the vapor channels 18A is reduced. A pressure distribution in the evaporator 2 involved in vapor generation is reduced. The vapor-phase working fluid generated by heat from the heat generating component 7, which is a heat source, is uniformly discharged to the vapor pipe 4. Consequently, it is possible to reduce a start-up time of the loop heat pipe 1.

Figure 5:
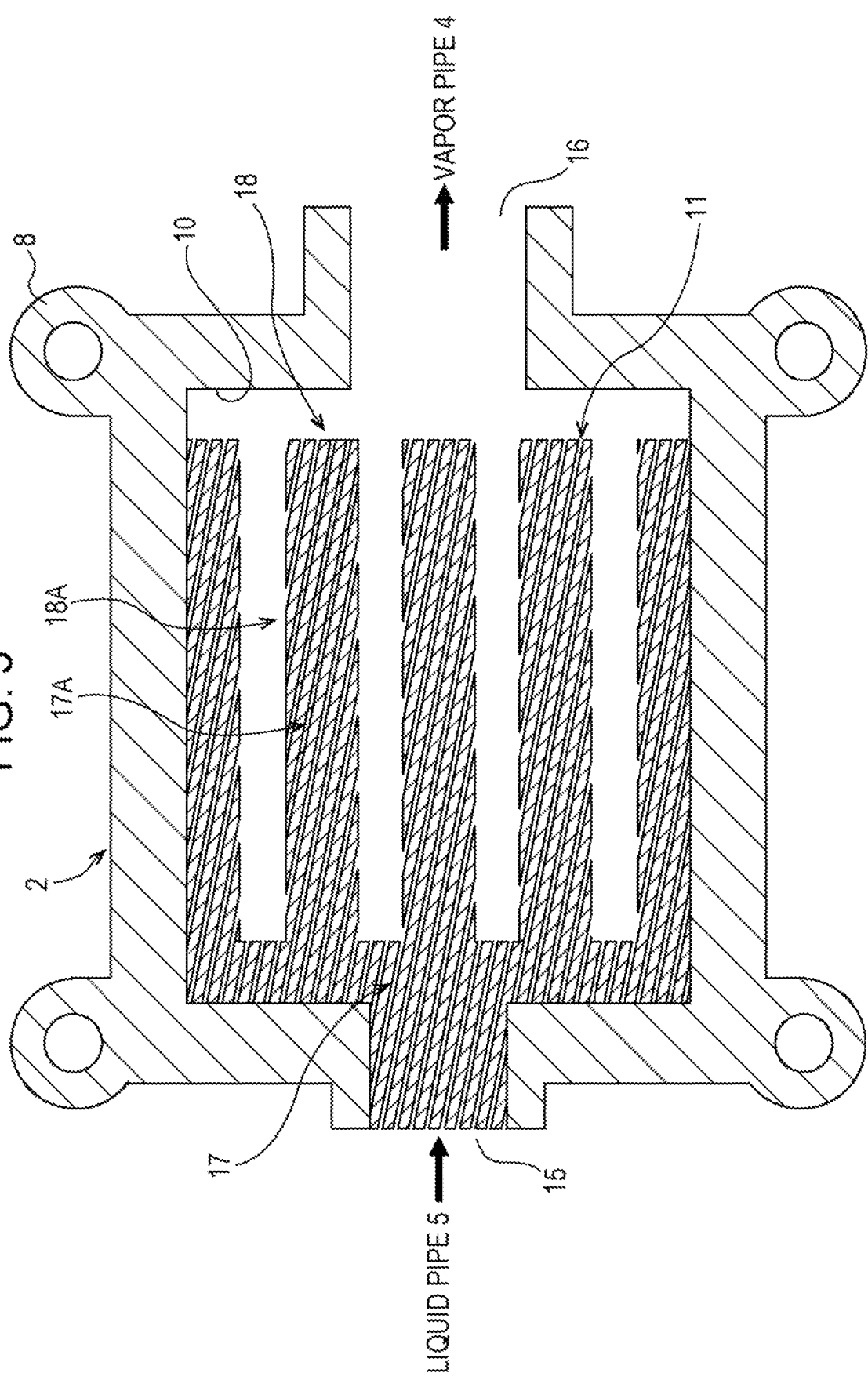
FIG. 5 is a schematic plan view illustrating a configuration example of the evaporator portion of the first tabular configuring the loop heat pipe according to the embodiment.

As illustrated in FIG. 5, the plurality of grooves 11 included in the first tabular 8 may be grooves extending in a direction crossing (obliquely crossing) the length direction. That is, for example, the plurality of grooves 11 may be provided in parallel to one another and to obliquely cross the length direction (to cross the length direction at a fixed angle). In the comb teeth-like vapor channel 18, the channel width of each of the divided plurality of vapor channels 18A is desirably larger than the width of the grooves 11 [see FIGS. 2A and 3 to 5]. That is, for example, the width of the first recessed section 10 configuring each of the divided plurality of vapor channels 18A in the comb teeth-like vapor channel 18 is desirably larger than the width of the grooves 11. Consequently, it is possible to reduce a pressure loss of the vapor channels.

The first recessed section 10 configuring each of the divided plurality of vapor channels 18A of the comb teeth-like vapor channel 18 only has a size for allowing the vapor-phase working fluid to flow and enabling the first recessed section 10 configure a channel for discharging the vapor-phase working fluid to the vapor pipe 4. The first recessed section 10 is referred to as groove as well. The number, the interval, and the shape of the divided plurality of portions 17A in the comb teeth-like portion 17 are not limited to the number, the interval, and the shape illustrated above. The number, the interval, and the shape of the divided plurality of vapor channels 18A in the comb teeth-like vapor channel 18 are not limited to the number, the interval, and the shape illustrated above. The number, the interval, the shape, the direction, and the like of the grooves 11 are not limited to the number, the interval, the shape, the direction, and the like illustrated herein. The evaporator 2 may be configured not to include the comb teeth-like portion 17 and the comb teeth-like vapor channel 18.

Figure 6:
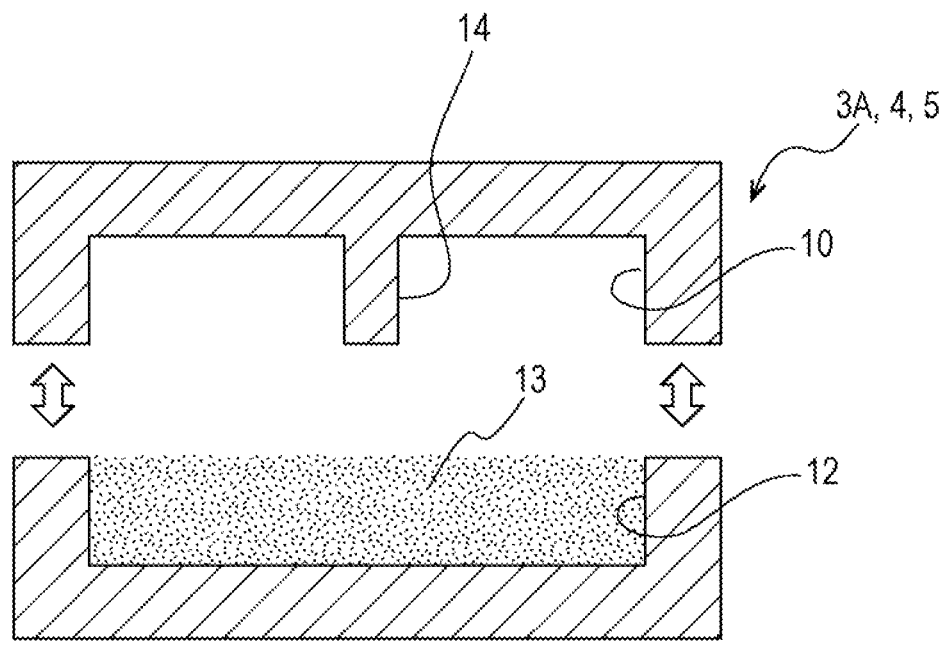
FIG. 6 is a schematic sectional view illustrating a vapor pipe, a condensation pipe, and a liquid pipe included in the loop heat pipe according to the embodiment.

As illustrated in FIG. 6, channels of the condensation pipe 3A, the vapor pipe 4, and the liquid pipe 5 are configured by the first recessed section 10 provided in the first tabular 8 and the second recessed section 12 provided in the second tabular 9. The first recessed section 10 is provided in the region to be formed as the condensation pipe 3A, the region to be formed as the vapor pipe 4, and the region to be formed as the liquid pipe 5 in the first tabular 8. The second recessed section 12 is provided in the region to be formed as the condensation pipe 3A, the region to be formed as the vapor pipe 4, and the region to be formed as the liquid pipe 5 in the second tabular 9. The first tabular 8 and the second tabular 9 are joined such that the first recessed section 10 and the second recessed section 12 are opposed to each other. Consequently, the channels of the condensation pipe 3A, the vapor pipe 4, and the liquid pipe 5 are configured.

Figure 7:
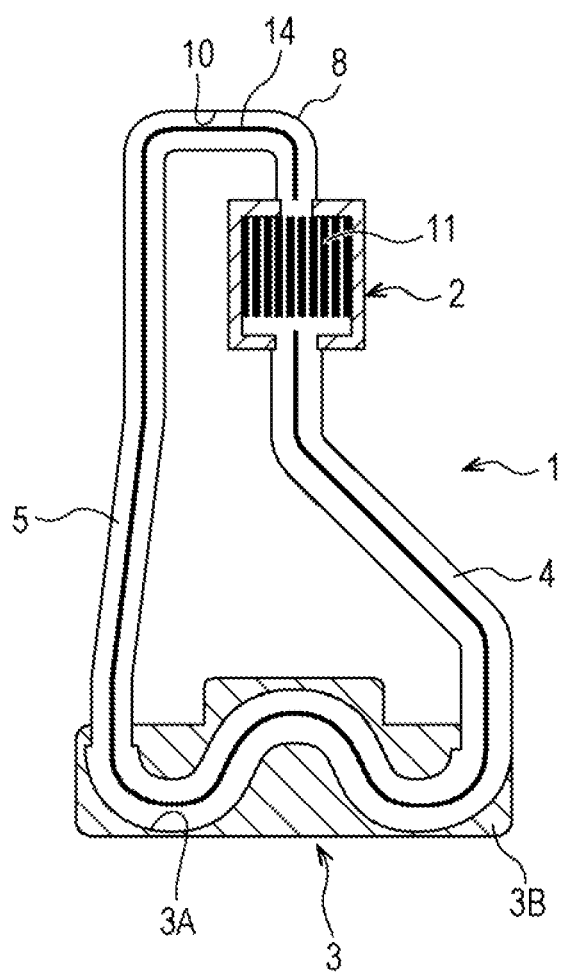
FIG. 7 is a schematic plan view illustrating a configuration example of the first tabular at the time when a column (a rib) is provided in the vapor pipe, the condensation pipe, and the liquid pipe in the loop heat pipe according to the embodiment.

In this case, as illustrated in FIGS. 6 and 7, the first tabular 8 desirably includes a column (a rib) 14 in the first recessed section 10. Consequently, when the first tabular 8 is jointed to the second tabular 9, it is possible to stop the first tabular 8 from being dented to reduce a channel sectional area. It is possible to reduce an increase in a pressure loss. For example, as illustrated in FIG. 7, in the first recessed section 10 provided in the region to be formed as the condensation pipe 3A, the region to be formed as the vapor pipe 4, and the region to be formed as the liquid pipe 5, the first tabular 8 desirably includes the column 14 to extend in parallel to a direction in which the first recessed section 10 extend.

For example, as illustrated in FIG. 6, the column 14 only has to be provided in a width direction center position on the inside of the first recessed section 10. In this case, the column 14 is provided in parallel along a channel configured by the first recessed section 10 provided in the region to be formed as the condensation pipe 3A configuring the condenser 3, the region to be formed as the vapor pipe 4, and the region to be formed as the liquid pipe 5. The channel is partitioned by the column 14 to form two recessed sections. Consequently, it is possible to stop the first tabular 8, that is, for example, the center of the channel from being dented to reduce a channel sectional area. It is possible to reduce an increase in a pressure loss.

Figure 10:
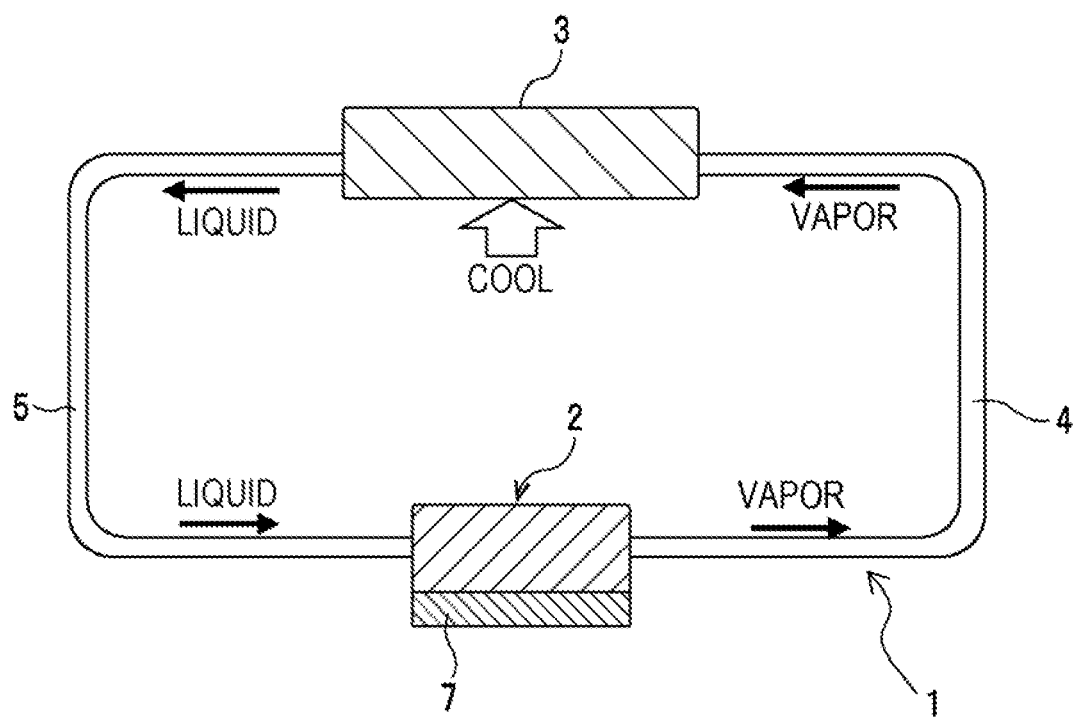
FIG. 10 is a schematic diagram for explaining the configuration and the operation of the loop heat pipe.

One column 14 is provided on the inside of the first recessed section 10. However, the column 14 is not limited to this. A plurality of columns 14 may be provided. The number, the interval, the shape, and the like of the columns 14 are not limited to the number, the interval, the shape, and the like illustrated herein. The loop heat pipe 1 is configured as explained above because of the following reasons. The loop heat pipe 1 includes, as illustrated in FIG. 10, the evaporator 2, the condenser 3, and the vapor pipe 4 and the liquid pipe 5 that couple the evaporator 2 and the condenser 3. The working fluid is encapsulated on the insides of the evaporator 2, the condenser 3, the vapor pipe 4, and the liquid pipe 5 at a fixed pressure.

The working fluid changes from the liquid phase to the vapor phase with heat supplied from the heat generating component 7 provided on the outside to the evaporator 2. The working fluid moves to the condenser 3 through the vapor pipe 4 while involving the heat. The working fluid changes from the vapor phase to the liquid phase with heat radiation in the condenser 3. The working fluid returns to the evaporator 2 through the liquid pipe 5. On the inside of the evaporator 2, a member (not illustrated in FIG. 10) called wick including micropores (thin holes) is housed. When the working fluid penetrates into the wick, a capillary force is generated in the micropores. The capillary force acts as a pumping force for fluid movement. In this embodiment, the grooves 11 capable of generating a capillary force is provided to function in the same manner as the wick.

When the evaporator 2 is heated by the heat generated by the heat generating component 7, the liquid-phase working fluid penetrated into the wick evaporates on the surface of the wick to generate the vapor-phase working fluid. The heat generated by the heat generating component 7 is used for the phase change from the liquid to the vapor in the evaporator 2. Therefore, the heat is taken away from the heat generating component 7. The vapor-phase working fluid (the vapor) generated in the evaporator 2 moves to the condenser 3 through the vapor pipe 4 and changes to the liquid-phase working fluid (hydraulic fluid) in the condenser 3.

The liquid-phase working fluid moves to the evaporator 2 through the liquid pipe 5. Such circulation of the working fluid is repeated, whereby transfer of the heat generated by the heat generating component 7 is continuously performed. In the loop heat pipe 1, the vapor-phase working fluid (the vapor) generated by heat reception in the evaporator 2 reaches the condenser 3 passing through the vapor pipe 4.

At this time, the liquid-phase working fluid (the hydraulic fluid) is ideally present from the liquid pipe 5 side of the condenser 3 to the evaporator 2. The hydraulic fluid penetrates the wick in the evaporator 2. A capillary force works in the micropores of the wick. The capillary force acts as a support and stops intrusion (backflow) of the vapor from the evaporator 2 to the direction of the liquid pipe 5. The capillary force generated when the hydraulic fluid penetrates into the wick is used as a driving source of a working fluid in the loop heat pipe 1.

The following condition is required for movement of fluid by the loop heat pipe 1, that is, for example, for the working fluid, which takes away latent heat at the evaporator 2 and liquefies in the condenser 3, to return to the evaporator 2.

$$\Delta P_{cap} \geq \Delta P_{total} \quad (1)$$

where, $\Delta P_{cap}$ represents a capillary pressure generated in the evaporator 2 and $\Delta P_{total}$ represents a total pressure loss of the channel of the loop heat pipe 1. That is, for example, $\Delta P_{total}$ is a sum of a pressure loss of the wick in the evaporator 2, a pressure loss in the vapor pipe 4, a pressure loss in the condensation pipe 3A, a pressure loss in the liquid pipe 5, and a gravity head (a pressure head).

In this case, if $\Delta P_{total}$ including the influence of the gravity is smaller than $\Delta P_{cap}$, irrespective of what kind of posture the loop heat pipe 1 takes, the loop heat pipe 1 may perform heat transfer by a loop operation. As illustrated in FIGS. 8 and 9, when such a loop heat pipe 1 is applied to the mobile device 6 (a smartphone), the loop heat pipe 1 is configured from the evaporator 2 in contact with the heat generating component 7, which is the heat source, the vapor pipe 4, the condenser 3 including the condensation pipe 3A and the heat diffusion plate 3B, and the liquid pipe 5. By transporting heat of the heat generating component 7 in contact with the evaporator 2 to a region having a relatively low temperature in the mobile device 6, the loop heat pipe 1 may diffuse the heat of the heat generating component 7.

However, when the loop heat pipe 1 is applied to the mobile device 6, the components of the loop heat pipe 1 requests to be reduced in thickness. For example, if the evaporator 2, the vapor pipe 4, the condenser 3, and the liquid pipe 5, which are the components of the loop heat pipe 1, are individually manufactured and connected by welding or the like, it is difficult to realize the reduction in thickness.

For example, a porous body such as sintered metal, sintered resin, or ceramics is used as the wick housed in the evaporator 2. According to a reduction of the thickness of the evaporator 2, the wick embedded in the evaporator 2 is also reduced in thickness. However, when the porous body made of the material is reduced in thickness, a fracture or a crack is likely to occur. Therefore, it is conceivable to manufacture the evaporator 2, the condenser 3, the vapor pipe 4, and the liquid pipe 5 by stacking a plurality of metal thin plates and diffusion-bonding of the plurality of metal thin plates and reduce the evaporator 2, the condenser 3, the vapor pipe 4, and the liquid pipe 5 in thickness.

Figure 11A:
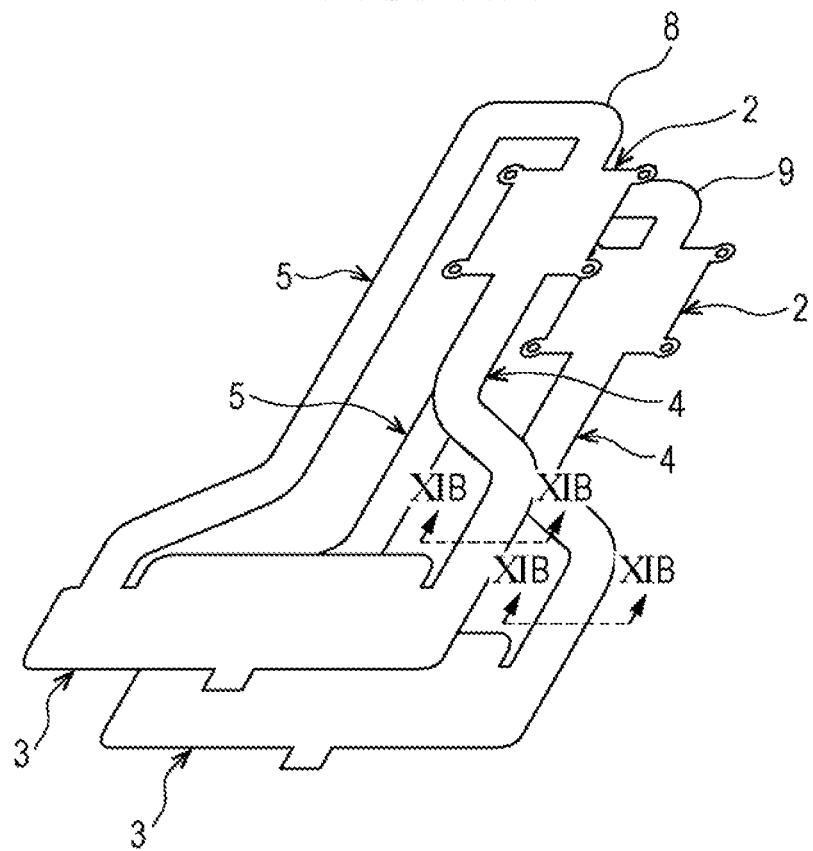
FIGS. 11A and 11B are schematic diagrams for explaining a loop heat pipe including two metal thin plates, FIG. 11A being a perspective view and FIG. 11B being a sectional view taken along XIB-XIB lines of FIG. 11A.
Figure 11B:
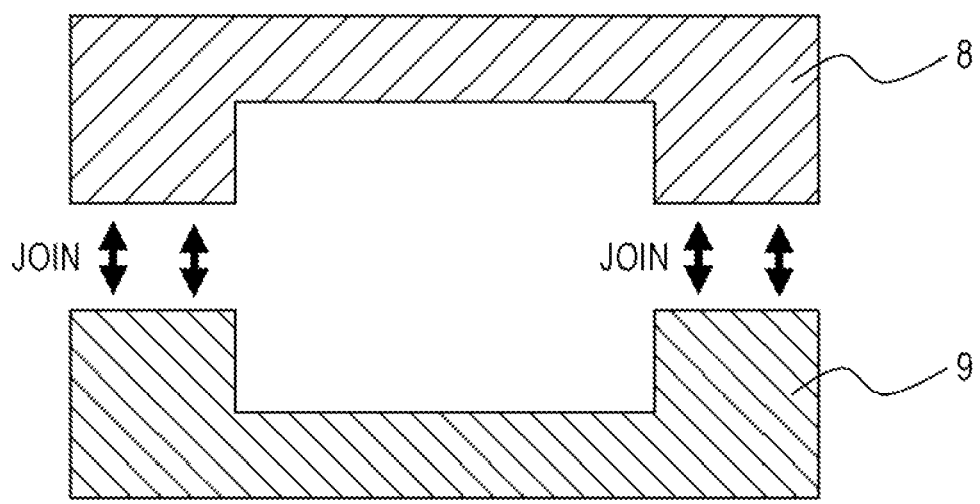

In order to realize a thinner loop heat pipe 1, it is also conceivable to use two metal thin plates 8 and 9 and join the two metal thin plates 8 and 9 to manufacture the evaporator 2, the condenser 3, the vapor pipe 4, and the liquid pipe 5 [see FIGS. 11A and 11B]. In this case, a channel only has to be formed by half-etching the two metal thin plates, that is, for example, patterning a recessed section having depth smaller than the plate thickness and sticking together the two metal thin plates.

In the region to be formed as the evaporator 2, in order to generates the capillary force, which is the driving source of the working fluid in the loop heat pipe 1, it is conceivable to form fine grooves in a metal thin plate by etching (for example, half-etching). However, in the loop heat pipe 1 reduced in thickness by using the two metal thin plates, the sectional area of the channel decreases and the flow of the working fluid is easily interrupted.

Therefore, it has been found that, simply by providing the fine grooves in the region to be formed as the evaporator 2 to generate the capillary force, the heat transfer by the loop operation is unable to be performed, for example, in an orientation in which the evaporator 2 is located above the condenser 3 (a top heat orientation). That is, for example, when the thin loop heat pipe 1 is mounted on an electronic device for mobile use, the loop heat pipe 1 is designed to satisfy the above Expression (1) such that the heat transfer by the loop operation may be performed in any orientation (setting orientation).

However, when the thin loop heat pipe 1 is manufactured using the two metal thin plates, the sectional area of the channel decreases, the flow of the working fluid is easily interrupted, and a pressure loss increases. In the top heat orientation affected by the gravity, a gravity head is also added to the pressure loss of the channel of the loop heat pipe 1.

Therefore, it has been found that the heat transport performance of the loop heat pipe 1 is markedly deteriorated, in particular, for example, in the top heat posture. This is because, even if fluctuation of the gravity head due to an orientation change occurs, the capillary force generated in the evaporator 2 is sufficiently large with respect to the channel orientation loss and it is difficult to satisfy the above Expression (1).

That is, for example, this is because, even in the top heat orientation, it is difficult to set the capillary force generated in the evaporator 2 sufficiently large to satisfy the above Expression (1), that is, for example, it is difficult to form, on the metal thin plate, fine grooves capable of generating a sufficiently large capillary force. Specifically, for example, the pressure loss increases according to the reduction in thickness. In the top heat orientation, movement of the vapor-phase working fluid (the vapor) present in the vapor pipe 4 stagnates.

Therefore, it is hard for the liquid-phase working fluid present in the liquid pipe 5 and the condensation pipe 3A to move to the evaporator 2. Since the movement of the vapor and the liquid in the loop heat pipe 1 stop, the heat transfer by the loop heat pipe 1 is not continuously performed. As the liquid disappears in the evaporator 2 soon, the evaporator 2 falls into dry-out.

Therefore, the loop heat pipe 1 is configured as explained above in order to make it possible to perform the heat transport by the loop motion in any orientation including the top heat orientation in the loop heat pipe 1 reduced in thickness by using the two tabulars 8 and 9. That is, for example, since the orientation structure 13 is provided over the entire channel of the loop heat pipe 1 as explained above, a capillary force generated in the porous structure 13 is added to the capillary force generated in the evaporator 2. Therefore, even when the gravity head is added in the top heat position, the capillary force is set to be sufficiently large with respect to all pressure losses of the channel.

Consequently, in the loop heat pipe 1 including the two tabulars 8 and 9 that may be provided at low cost and may realize a reduction in thickness, the heat transport by the loop operation may be performed in any orientation. The loop heat pipe 1 configured by the two tabulars, that is, for example, the first tabular 8 and the second tabular 9 as explained above may be manufacture as explained below.

First, the first tabular 8 is processed (for example, half-etched) to form the first recessed section 10 in the region to be formed as the evaporator 2, the region to be formed as the condensation pipe 3A configuring the condenser 3, the region to be formed as the vapor pipe 4, and the region to be formed as the liquid pipe 5 and form, in the region to be formed as the evaporator 2, the grooves 11 capable of generating a capillary force [see, for example, FIGS. 1A, 2A, 3 to 5, and 6]. In this process for processing the first tabular 8, it is desirable to form the grooves 11 in the region to be formed as the comb teeth-like portion 17 of the evaporator 2 in the first tabular 8 and form the first recessed section 10 in the region to be formed as the comb teeth-like vapor channel 18 of the evaporator 2 in the first tabular 8 [see, for example, FIGS. 2A and 3 to 5]. In the process for processing the first tabular 8, the column 14 may be formed in the first recessed section 10 of the first tabular 8 [see, for example, FIGS. 6 and 7].

The second tabular 9 is processed (for example, half-etched) to form the second recessed section 12 in the region to be formed as the evaporator 2, the region to be formed as the condensation pipe 3A, the region to be formed as the vapor pipe 4, and the region to be formed as the liquid pipe 5 [see, for example, FIGS. 1B, 2B, and 6]. The porous structure 13 is provided in the second recessed section 12 [see, for example, FIGS. 1B, 2B, and 6].

The first tabular 8 and the second tabular 9 are joined [see, for example, FIGS. 1A, 1B, 2A, 2B, and 6]. In this way, the loop heat pipe 1 may be manufactured. Desirably, in the region to be formed as the comb teeth-like vapor channel 18 of the evaporator 2, the region to be formed as the condensation pipe 3A configuring the condenser 3, the region to be formed as the vapor pipe 4, and the region to be formed as the liquid pipe 5 in one of the two metal thin plates (two surface sheets) functioning as the first tabular 8 and the second tabular 9, the first recessed section 10 configuring the channels of the comb teeth-like vapor channel 18 of the evaporator 2, the vapor pipe 4, the condensation pipe 3A included in the condenser 3, and the liquid pipe 5 is provided to have depth smaller than the plate thickness by processing such as half-etching and, in the region to be formed as the comb teeth-like portion 17 of the evaporator 2, the grooves 11 capable of generating a capillary force are provided to have depth smaller than the plate thickness by processing such as half-etching [see, for example, FIGS. 1A, 2A, 3 to 5, and 6].

In the region to be formed as the evaporator 2, the region to be formed as the condensation pipe 3A, the region to be formed as the vapor pipe 4, and the region to be formed as the liquid pipe 5 in the other of the two metal thin plates, the second recessed section 12 configuring the channels of the vapor pipe 4, the condensation pipe 3A included in the condenser 3, and the liquid pipe 5 is provided to have depth smaller than the plate thickness by processing such as half-etching [see, for example, FIGS. 1B, 2B, and 6]. The porous structure 13 is provided in the second recessed section 12 provided in the other of the two metal thin plates [see, for example, FIGS. 1B, 2B, and 6].

With the grooves 11 and the first recessed section 10 set opposed to the porous structure 13, the two metal thin plates only have to be diffusion-bonded to configure the thin loop heat pipe 1. The first and second recessed sections 10 and 12 provided in the regions to be formed as the condensation pipe 3A of the first tabular 8 and the second tabular 9 are provided to meander such that efficiency of heat exchange with the outdoor air is improved and condensation may be sufficiently performed. When the first and second recessed sections 10 and 12 are patterned into the respective shapes of the evaporator 2, the vapor pipe 4, the condenser 3, and the liquid pipe 5, the tabulars are left in a flat shape around the region to be formed as the condensation pipe 3A included in the condenser 3 such that a portion of the remaining tabulars functions as the heat diffusion plate 3B included in the condenser 3.

Figure 12:
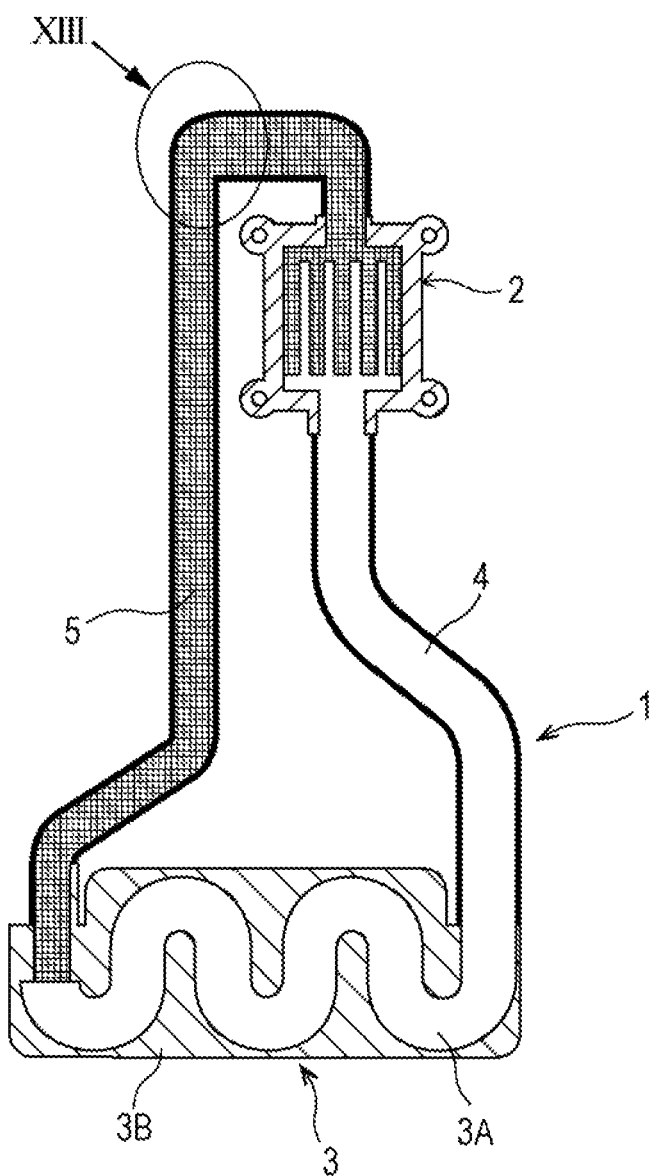
FIG. 12 is a schematic plan view for explaining a configuration in which grooves are also provided in a liquid pipe portion of the first tabular configuring the loop heat pipe according to the embodiment.
Figure 13:
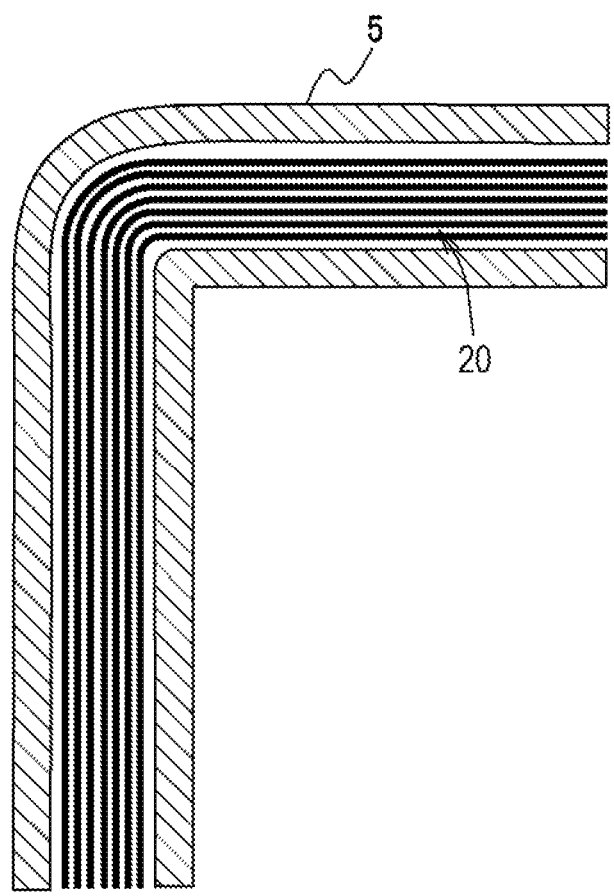
FIG. 13 is a schematic plan view for explaining the configuration in which the grooves are also provided in the liquid pipe portion of the first tabular configuring the loop heat pipe according to the embodiment and is an enlarged diagram of a portion indicated by a sign XIII in FIG. 12.
Figure 14A:
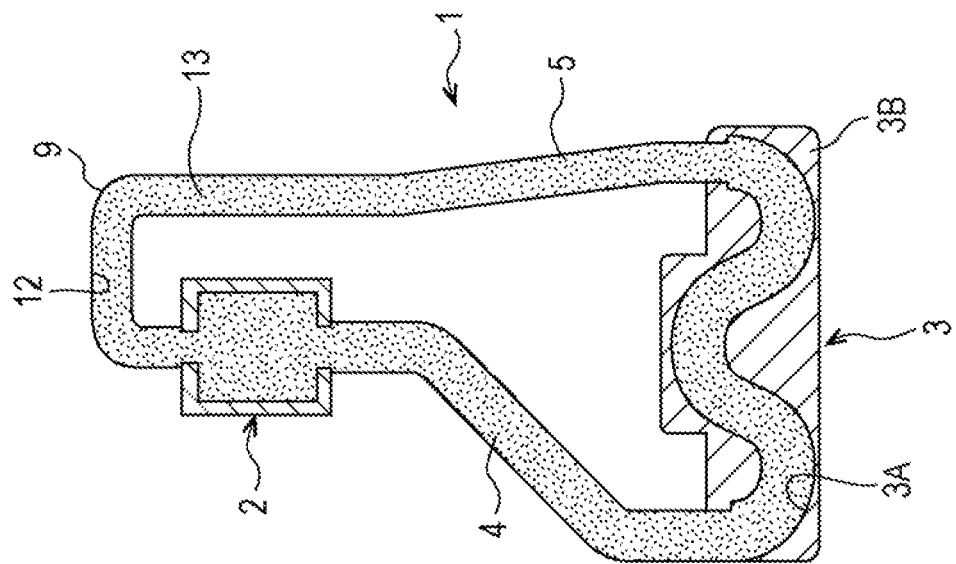
FIGS. 14A and 14B are schematic diagrams for explaining a specific configuration example of the loop heat pipe according to the embodiment and a manufacturing method for the loop heat pipe.
Figure 14B:
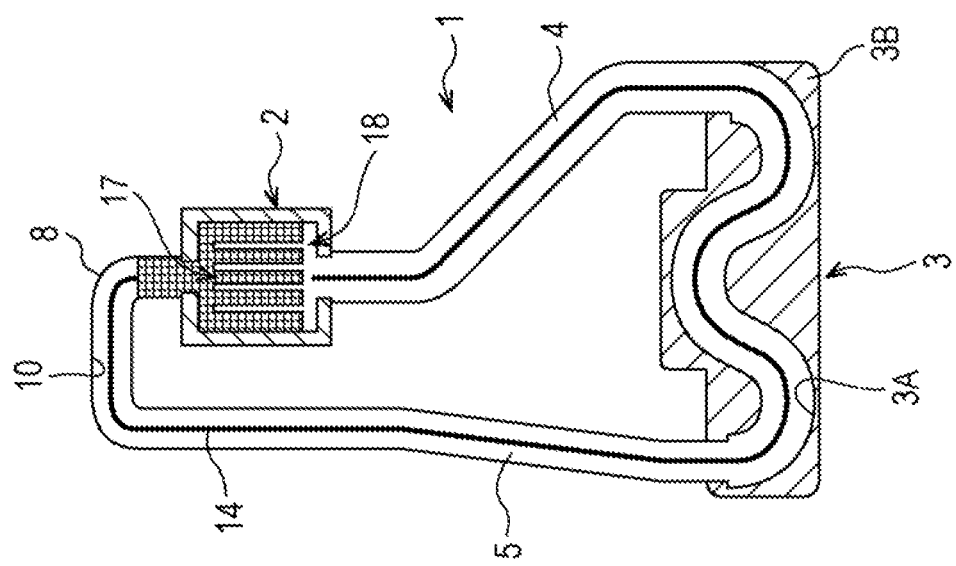

In loop heat pipe 1 explained above, the grooves 11 are not provided in the vapor pipe 4, the condensation pipe 3A, and the liquid pipe 5. However, the loop heat pipe 1 is not limited to this. For example, a structure same as the grooves 11 capable of generating a capillary force provided in the evaporator 2 may be provided in the liquid pipe 5. That is, for example, as illustrated in FIGS. 12 and 13, the first tabular 8 may include, in the region to be formed as the liquid pipe 5, liquid pipe grooves 20 capable of generating a capillary force. In FIG. 12, a pattern is applied to a region where the liquid pipe grooves 20 are provided.

In this case, in the process for processing the first tabular 8 in the manufacturing method for the loop heat pipe 1 explained above, the liquid pipe grooves 20 capable of generating a capillary force only have to be formed in the region to be formed as the liquid pipe 5 in the first tabular 8. For example, the first tabular 8 may include, as the liquid pipe grooves 20, a plurality of grooves extending in the length direction of the region to be formed as the liquid pipe 5. For example, the first tabular 8 only has to include, as the liquid pipe grooves 20, a plurality of grooves extending in the width direction of the region to be formed as the liquid pipe 5. In FIG. 13, the liquid pipe grooves 20 extending in the length direction of the liquid pipe 5 are illustrated.

The liquid pipe grooves 20 may be provided over the entire liquid pipe 5 or may be provided in a part of the liquid pipe 5. The number, the interval, and the shape of the liquid pipe grooves 20 are not limited to the number, the interval, and the shape illustrated herein. The liquid pipe grooves 20 capable of generating a capillary force are provided in the liquid pipe 5 as well in this way such that, in particular, for example, in the top heat posture, the liquid-phase working fluid flows inside the liquid pipe 5, easily flows into the evaporator 2, and the loop heat pipe 1 stably operates.

A specific configuration example of the loop heat pipe 1 and a manufacturing method for the loop heat pipe 1 are explained below. First, a first copper thin plate 8 having thickness of approximately 0.25 mm is used. The first copper thin plate 8 is patterned by a resist into a shape illustrated in FIG. 14A and, thereafter, exposed copper is etched. The width of the vapor pipe 4 and the condensation pipe 3A included in the condenser 3 is approximately 7 mm and the width of the liquid pipe 5 is approximately 6 mm.

The first copper thin plate 8 is etched (half-etched) to depth of approximately 0.15 mm to form the first recessed section 10 configuring the channels of the comb teeth-like vapor channel 18 of the evaporator 2, the vapor pipe 4, the condensation pipe 3A, and the liquid pipe 5. At this time, the column (the rib) 14 is also formed in the first recessed section 10. The first copper thin plate 8 is etched (half-etched) to form the fine grooves 11 in the comb teeth-like portion 17 of the evaporator 2 [see, for example, FIG. 2A].

The width and the interval of the grooves 11 is approximately 0.2 mm and the depth of the grooves 11 is approximately 0.12 mm. The width of a groove, which is the first recessed section 10 (a wide groove), configuring the comb teeth-like vapor channel 18 is approximately 1 mm and the depth of the groove is approximately 0.15 mm. Subsequently, a second copper thin plate 9 having thickness of approximately 3 mm is used. The second copper thin plate 9 is patterned by a resist into a shape illustrated in FIG. 14B and, thereafter, exposed copper is etched.

The width of the vapor pipe 4 and the condensation pipe 3A included in the condenser 3 is approximately 7 mm and the width of the liquid pipe 5 is approximately 6 mm. The second copper thin plate 9 is etched (half-etched) to depth of approximately 0.15 mm to form the second recessed section 12 configuring the channels of the evaporator 2, the vapor pipe 4, the condensation pipe 3A, and the liquid pipe 5.

In the second recessed section 12 etched on the second copper thin plate 9, as the porous structure 13, a mesh material (a copper mesh) obtained by wire-netting a copper wire having a line diameter of approximately 0.05 mm is disposed in three layers. The mesh material is opened at random. An average diameter of opening sections is approximately 0.1 mm. The first copper thin plate 8 including the grooves 11 and the first recessed section 10 etched as explained above and the second copper thin plate 9 on which the copper mesh 13 stacked in three layers in the second recessed section 12 etched as explained above is disposed are diffusion-bonded with the grooves 11 and the first recessed section 10 set opposed to the porous structure 13. After the inside of a space formed by the diffusion-bonded first and second copper thin plates 8 and 9 is vacuum-exhausted from a liquid injection port, water (or ethanol or fluorocarbon) is injected into a pipe as hydraulic fluid. Consequently, the thin loop heat pipe 1 having thickness of approximately 0.5 mm may be manufactured.

In the loop heat pipe 1 manufactured in this way, as the porous structure 13, instead of the mesh material, for example, a porous body made of sintered metal of copper having thickness of approximately 0.15 mm molded into the shape of the second recessed section 12 (in FIG. 14B, see a patterned portion) etched on the second copper thin plate 9 may be disposed. An average diameter of holes of the porous body is approximately 0.03 mm.

For example, as the porous structure 13, nonwoven fabric made of stainless steel having a fiber diameter of approximately 0.03 mm molded into the shape of the second recessed section 12 (in FIG. 14B, see a patterned portion) etched on the second copper thin plate 9 may be disposed. For example, as the porous structure 13, a porous body made of sintered metal of SUS having thickness of approximately 0.15 mm molded into the shape of the second recessed section 12 (in FIG. 14B, see a patterned portion) etched on the second copper thin plate 9 may be disposed. An average diameter of holes of the porous body is approximately 0.02 mm.

In the loop heat pipe 1 manufactured as explained above, for example, the width of the vapor pipe 4 and the condensation pipe 3A included in the condenser 3 may be set to approximately 6 mm and the width of the liquid pipe 5 may be set to approximately 5 mm to form the thin loop heat pipe 1 having thickness of approximately 0.5 mm. For example, the thickness of the first copper thin plate 8 and the second copper thin plate 9 may be set to approximately 0.3 mm and the width of the vapor pipe 4 and the condensation pipe 3A included in the condenser 3 may be set to approximately 8 mm to form the thin loop heat pipe 1 having thickness of approximately 0.6 mm.

In the loop heat pipe 1 manufactured as explained above, the pattern of the fine grooves 11 provided in the regions to be the evaporator 2 of the first copper thin plate 8 and the second copper thin plate 9 may be etched (half-etched) to form the pattern illustrated in FIGS. 3 to 5. In this case, the same dimensions as the dimensions described above only have to be set. In the loop heat pipe 1 manufactured as explained above, when the liquid pipe grooves 20 capable of generating a capillary force are formed on the inside of the liquid pipe 5 as well (see FIGS. 12 and 13), the liquid pipe grooves 20 only have to be formed by etching (half-etching) in the region to be formed as the liquid pipe 5 in the first copper thin plate 8.

The shape and the piping pattern of the loop heat pipe 1 are not limited to the shape and the piping pattern explained above. The copper thin plate is used as the metal thin plate. However, the metal thin plate only has to be collectively formed by diffusion-bonding. The material of the metal thin plate is not limited to copper and only has to be a material suitable for the pattern formation and the diffusion bonding by etching or the like such as stainless steel (SUS) and an alloy material. The dimensions of the loop heat pipe 1 are not limited to the dimensions described above. The dimensions only have to be optimized as appropriate according to a required heat transport amount, a required heat transport distance, a required pipe height, and a required pipe width.

In the loop heat pipe 1 manufactured as explained above, the working fluid is retained in the evaporator 2 and the entire channel of the thin loop heat pipe 1 by a capillary phenomenon caused by intrusion of the liquid-phase working fluid into the porous structure 13. Consequently, in the top heat posture, when the working fluid evaporates on the inside of the evaporator 2 with the heat from the heat source and the vapor (the vapor-phase working fluid) moves in the vapor pipe 4, the working fluid retained by the porous structure 13 moves to the evaporator 2 side little by little.

Figure 15:
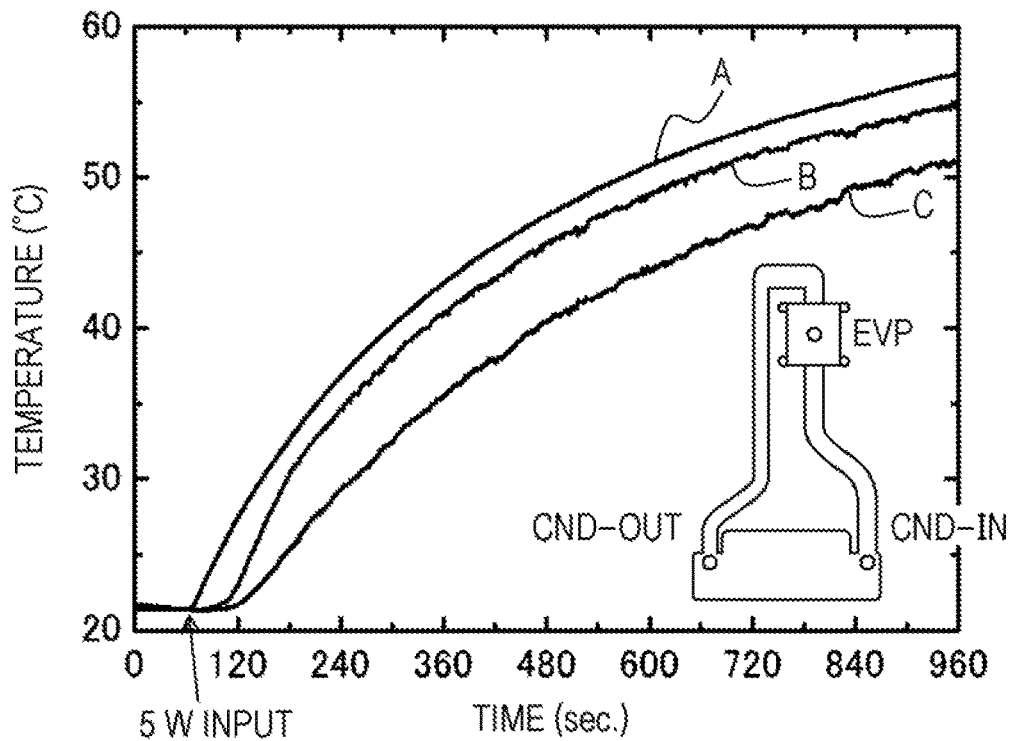
FIG. 15 is a diagram illustrating temperature changes that occur when the loop heat pipe in the embodiment is set in a top heat orientation at a heat input of approximately 5 W to the evaporator in the loop heat pipe.

Since the working fluid is supplied into the evaporator 2 in this way, evaporation may be continued. Therefore, the heat transport by the loop operation in the top heat posture may be realized. FIG. 15 illustrates changes in an evaporator temperature (EVP), a condenser inlet temperature (CND-IN), and a condenser outlet temperature (CND-OUT) that occur when the loop heat pipe 1 [see FIGS. 14A and 14B] manufactured as explained above is set in the top heat orientation and a heat input of approximately 5 W is applied to the loop heat pipe 1.

Figure 16:
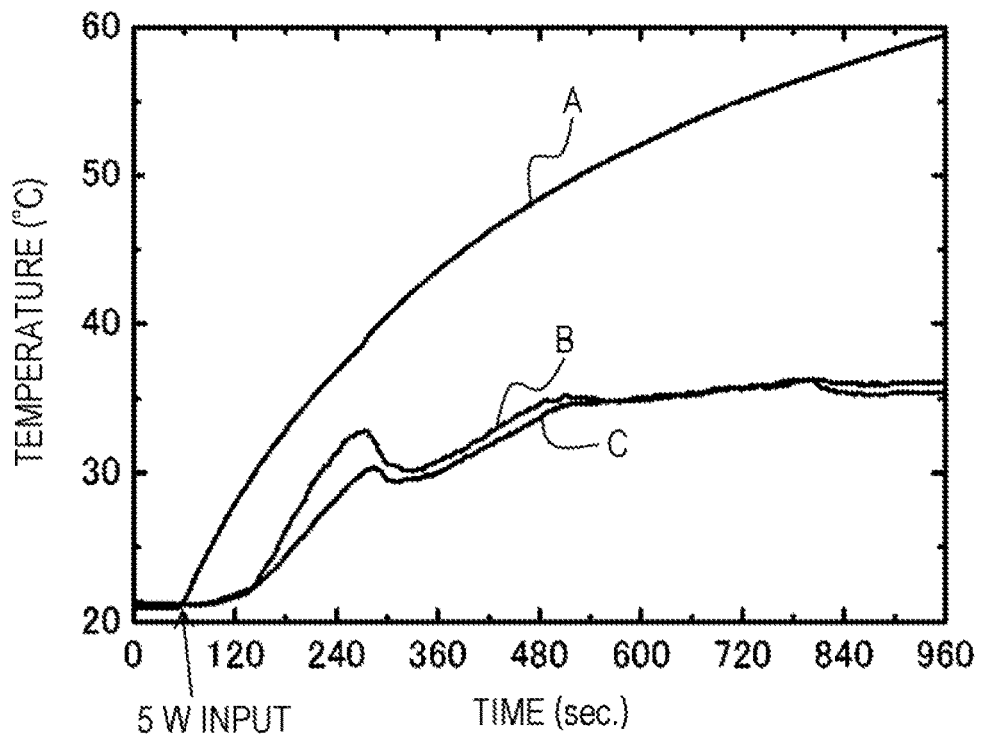
FIG. 16 is a diagram illustrating temperature changes that occur when a loop heat pipe including an evaporator formed by only grooving is set in the top heat posture and a heat input of approximately 5 W is applied to the loop heat pipe.

In FIG. 15, a solid line A indicates the change in the evaporator temperature (EVP), a solid line B indicates the change in the condenser inlet temperature (CND-IN), and a solid line C indicates the change in the condenser outlet temperature (CND-OUT). FIG. 16 illustrates changes in the evaporator temperature (EVP), the condenser inlet temperature (CND-IN), and the condenser outlet temperature (CND-OUT) that occur when a loop heat pipe including the evaporator 2 formed by only grooving illustrated in FIGS. 17A and 17B is set in the top heat orientation and a heat input of approximately 5 W is applied to the loop heat pipe.

Figure 17A:
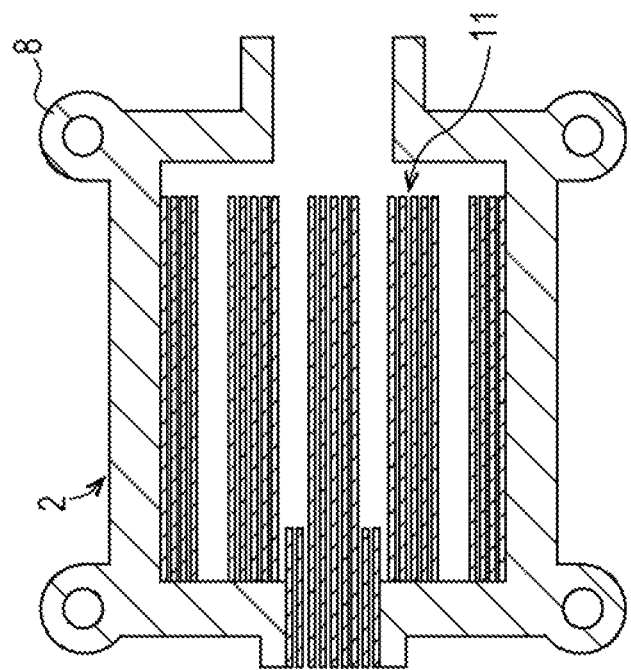
FIGS. 17A and 17B are schematic plan views illustrating a configuration example of the evaporator included in the loop heat pipe including the evaporator formed by only grooving, FIG. 17A illustrating a configuration example of a first tabular and FIG. 17B illustrating a configuration example of a second tabular.
Figure 17B:
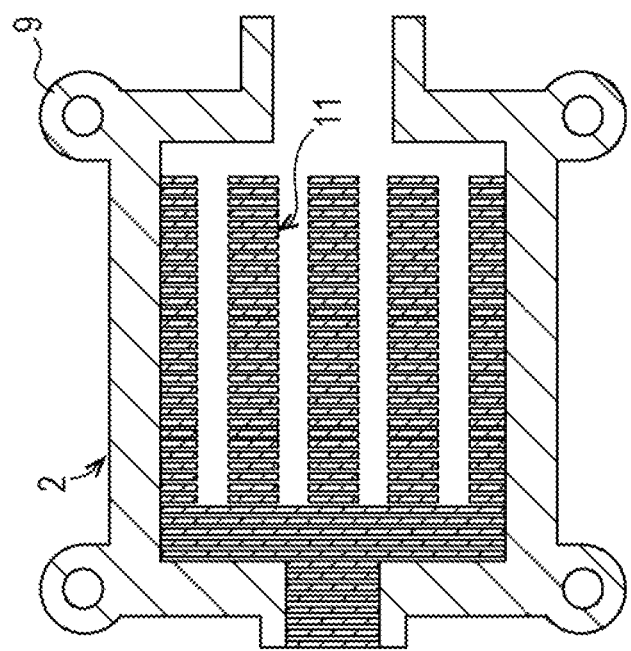

The evaporator 2 formed by only grooving is the evaporator 2 in which, as illustrated in FIG. 17A, the grooves 11 are formed on one first copper thin plate 8 of the two copper thin plates to extend in the length direction of the evaporator 2 and the grooves 11 are formed on the other copper thin plate 9 to extend in the width direction of the evaporator 2. In FIG. 16, a solid line A indicates a change in the evaporator temperature (EVP), a solid line B indicates a change in the condenser inlet temperature (CND-IN), and a solid line C indicates a change in the condenser outlet temperature (CND-OUT).

As illustrated in FIG. 16, when the loop heat pipe including the evaporator 2 formed by only grooving is set in the top heat orientation and a heat input of approximately 5 W is applied to the loop heat pipe, whereas the evaporator temperature rises as indicated by the solid line A in FIG. 16, the condenser temperature does not rise as indicated by the solid lines B and C in FIG. 16. That is, for example, a heat input to the evaporator 2 is not transported to the condenser 3. On the other hand, as illustrated in FIG. 15, when the loop heat pipe 1 manufactured as explained above is set in the top heat orientation and a heat input of approximately 5 W is applied to the loop heat pipe 1, the evaporator temperature rises as indicated by the solid line A in FIG. 15 and the condenser temperature also rises as indicated by the solid lines B and C in FIG. 15. That is, for example, the loop heat pipe 1 manufactured as explained above is considered to perform heat transport in the top heat orientation.

Figure 18B:
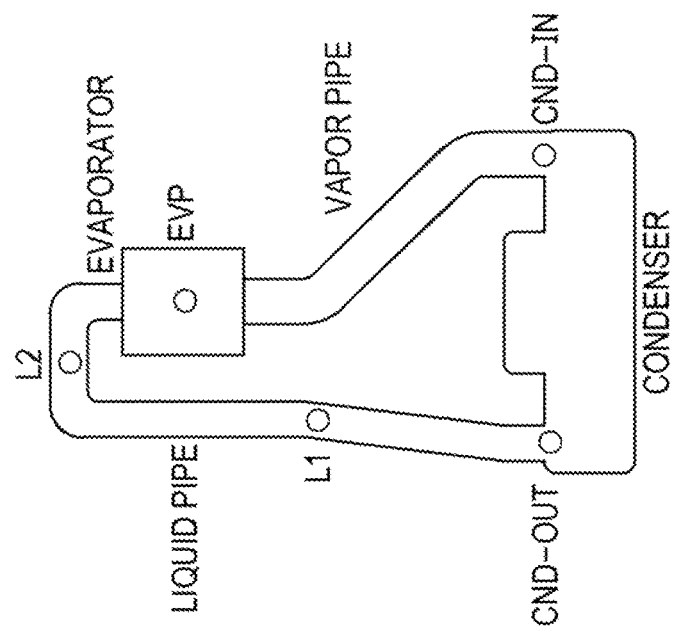
FIG. 18B is a diagram illustrating temperature measurement points.
Figure 18A:
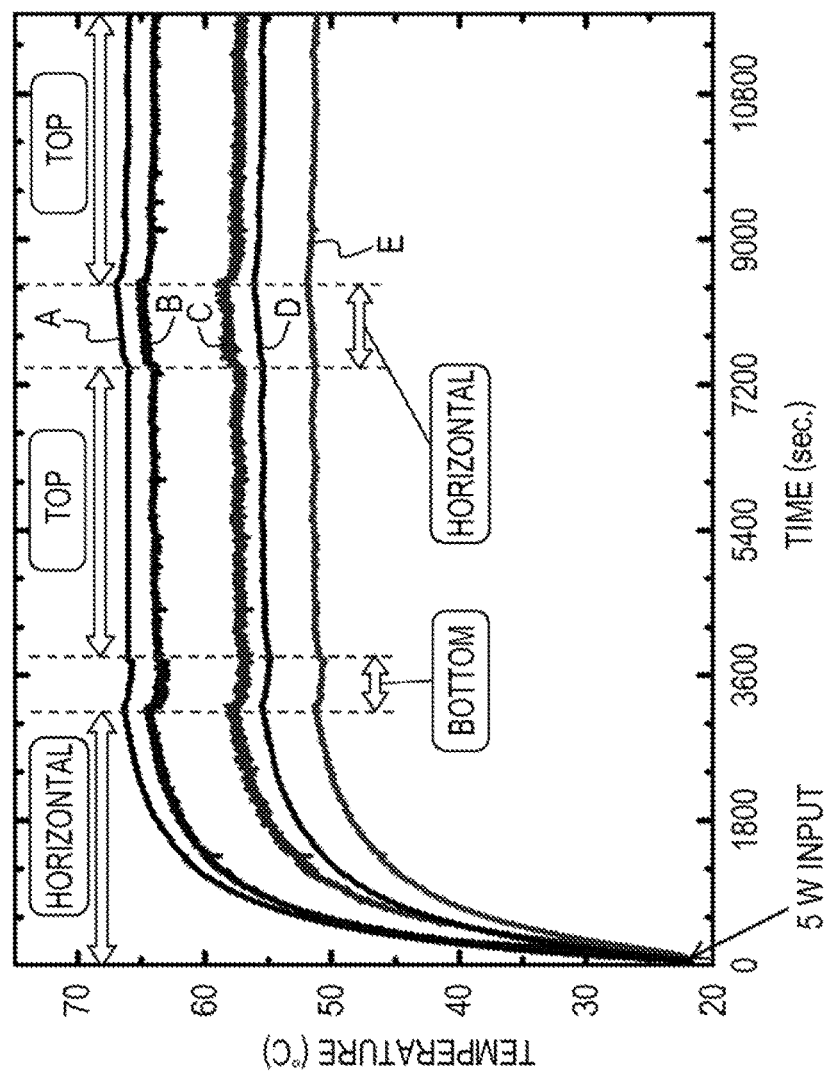
FIG. 18A is a diagram illustrating temperature changes that occur when a posture of the loop heat pipe is changed in a state in which a heat input of approximately 5 W is applied to the loop heat pipe in the embodiment.

FIG. 18A illustrates temperature changes that occur when an orientation of the loop heat pipe 1 manufactured as explained above is changed in a state in which a heat input of approximately 5 W is applied to the evaporator 2. FIG. 18B illustrates temperature measurement parts of the loop heat pipe 1, that is, for example, respective measurement parts of the evaporator temperature (EVP), the condenser inlet temperature (CND-IN), the condenser outlet temperature (CND-OUT), temperature of a part of the liquid pipe (L2), and temperature of another part of the liquid pipe (L1).

An orientation in which the evaporator is located below the condenser with respect to the gravity oppositely to the top heat orientation is referred to as bottom heat posture. An orientation in which the evaporator and the condenser are located in the same level is referred to as horizontal orientation. In FIG. 18A, the top heat posture is represented as "top", the bottom heat orientation is represented as "bottom", and the horizontal orientation is represented as "horizontal". In FIG. 18A, a solid line A indicates a change in the evaporator temperature (EVP), a solid line B indicates a change in the condenser inlet temperature (CND-IN), a solid line C indicates a change in the condenser outlet temperature (CND-OUT), a solid line D indicates a change in the temperature of a part of the liquid pipe (L2), and a solid line E indicates a change in temperature of another part of the liquid pipe (L1).

As illustrated in FIG. 18A, in a state in which the loop heat pipe 1 manufactured as explained above is started in the horizontal orientation (a heat input of approximately 5 W is applied to the loop heat pipe 1) and heat transport is performed, when the orientation of the loop heat pipe 1 is transitioned to the bottom heat orientation, the top heat orientation, the horizontal orientation, and the top heat orientation, the temperatures of the sections of the loop heat pipe 1 hardly fluctuate as indicated by the solid lines A to E in FIG. 18A. In this way, the loop heat pipe 1 manufactured as explained above is capable of reducing fluctuation in heat transport performance with the orientation of the loop heat pipe 1.

Therefore, with the loop heat pipe and the manufacturing method for the loop heat pipe and the electronic device according to this embodiment, there is an advantage that the heat transport by the loop operation may be performed in any orientation in the loop heat pipe 1 reduced in thickness using the two tabulars 8 and 9. The present disclosure is not limited to the configurations described in the embodiment and the modifications and may be variously modified without departing from the spirit of the present disclosure. The embodiment and the modifications may be combined as appropriate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A loop heat pipe comprising:
   an evaporator;
   a condenser;
   a first pipe configured to connect the evaporator and the condenser and in which vapor-phase working fluid flows; and
   a second pipe configured to connect the condenser and the evaporator and in which liquid-phase working fluid flows, wherein
   the evaporator, the condenser, the first pipe, and the second pipe is configured to join a first tabular and a second tabular,
   the first tabular includes a first recessed section in a region to be formed as the evaporator, a region to be formed as a condensation pipe configuring the condenser, a region to be formed as the first pipe, and a region to be formed as the second pipe and includes, in the region to be formed as the evaporator, grooves capable of generating a capillary force,
   the second tabular includes a second recessed section in the region to be formed as the evaporator, the region to be formed as the condensation pipe, the region to be formed as the first pipe, and the region to be formed as the second pipe, and
   a porous structure is provided in the entire second recessed section.

2. The loop heat pipe according to claim 1, wherein the first tabular includes, as the grooves, a plurality of grooves extending in a width direction crossing a length direction directed from a side to which the second pipe is connected toward a side to which the first pipe is connected.

3. The loop heat pipe according to claim 1, wherein the first tabular includes, as the grooves, a plurality of grooves extending in a length direction directed from a side to which the second pipe is connected toward a side to which the first pipe is connected.

4. The loop heat pipe according to claim 1, wherein
   the evaporator includes a comb teeth-like portion divided and extending from a side to which the second pipe is connected, the liquid-phase working fluid penetrating into the comb teeth-like portion to change to the vapor-phase working fluid, and a comb teeth-like vapor channel provided to be opposed to the comb teeth-like portion and divided and extending from a side to which the first pipe is connected, the vapor-phase working fluid flowing in the comb teeth-like vapor channel, and the first tabular includes the grooves in a region to be formed as the comb teeth-like portion and includes the first recessed section in a region to be formed as the comb teeth-like vapor channel.

5. The loop heat pipe according to claim 4, wherein the first tabular includes, in a region to be formed as a divided plurality of portions of the comb teeth-like portion, communication grooves that cause adjacent two vapor channels among a divided plurality of vapor channels of the comb teeth-like vapor channels to communicate.

6. The loop heat pipe according to claim 4, wherein, in the comb teeth-like vapor channel, a channel width of each of a divided plurality of vapor channels is larger than width of the grooves.

7. The loop heat pipe according to claim 1, wherein the first tabular includes a column in the first recessed section.

8. The loop heat pipe according to claim 1, wherein the first tabular includes, in the region to be formed as the second pipe, second pipe grooves capable of generating the capillary force.

9. The loop heat pipe according to claim 8, wherein the first tabular includes, as the second pipe grooves, a plurality of grooves extending in a width direction of the region to be formed as the second pipe.

10. The loop heat pipe according to claim 8, wherein the first tabular includes, as the second pipe grooves, a plurality of grooves extending in a length direction of the region to be formed as the second pipe.

11. The loop heat pipe according to claim 1, wherein the first tabular and the second tabular are respectively metal plates.

12. The loop heat pipe according to claim 1, wherein the porous structure has structure in which vacancies are exposed to a surface of the structure and communicate with one another.

13. An electronic device comprising:
a heat generating component; and
a loop heat pipe configured to transfer heat of the heat generating component, wherein
the loop heat pipe includes
an evaporator in which a liquid-phase working fluid evaporates;
a condenser in which a vapor-phase working fluid condenses;
a first pipe configured to connect the evaporator and the condenser, the vapor-phase working fluid flowing in the first pipe; and
a second pipe configured to connect the condenser and the evaporator, the liquid-phase working fluid flowing in the second pipe,
the evaporator, the condenser, the first pipe, and the second pipe have structure obtained by joining a first tabular and a second tabular,
the first tabular includes a first recessed section in a region to be formed as the evaporator, a region to be formed as a condensation pipe configuring the condenser, a region to be formed as the first pipe, and a region to be formed as the second pipe and includes, in the region to be formed as the evaporator, grooves capable of generating a capillary force,
the second tabular includes a second recessed section in the region to be formed as the evaporator, the region to be formed as the condensation pipe, the region to be formed as the first pipe, and the region to be formed as the second pipe, and
a porous structure is provided in the entire second recessed section.

14. A manufacturing method for a loop heat pipe, comprising:
processing a first tabular to form a first recessed section in a region to be formed as an evaporator, a region to be formed as a condensation pipe configuring a condenser, a region to be formed as a first pipe, and a region to be formed as a second pipe and form, in the region to be the evaporator, grooves capable of generating a capillary force;
processing a second tabular to form a second recessed section in the region to be formed as the evaporator, the region to be formed as the condensation pipe, the region to be formed as the first pipe, and the region to be formed as the second pipe;
providing a porous structure in the entire second recessed section; and
joining the first tabular and the second tabular.

15. The manufacturing method for the loop heat pipe according to claim 14, wherein, in the processing the first tabular, the grooves are formed in a region to be formed as a comb teeth-like portion of the evaporator in the first tabular and the first recessed section is formed in a region to be formed as a comb teeth-like vapor channel of the evaporator in the first tabular.

16. The manufacturing method for the loop heat pipe according to claim 14, wherein, in the processing the first tabular, a column is formed in the first recessed section of the first tabular.

17. The manufacturing method for the loop heat pipe according to claim 14, wherein, in the processing the first tabular, second pipe grooves capable of generating the capillary force is formed in a region to be formed as the second pipe in the first tabular.

* * * * *